United States Patent
Marakhtanov et al.

(10) Patent No.: US 12,266,505 B2
(45) Date of Patent: Apr. 1, 2025

(54) SYSTEMS AND METHODS FOR USING BINNING TO INCREASE POWER DURING A LOW FREQUENCY CYCLE

(71) Applicant: Lam Research Corporation, Fremont, CA (US)

(72) Inventors: Alexei Marakhtanov, Albany, CA (US); Felix Leib Kozakevich, Sunnyvale, CA (US); Ranadeep Bhowmick, San Jose, CA (US); Bing Ji, Pleasanton, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 17/801,227

(22) PCT Filed: Feb. 8, 2021

(86) PCT No.: PCT/US2021/017098
§ 371 (c)(1),
(2) Date: Aug. 19, 2022

(87) PCT Pub. No.: WO2021/173334
PCT Pub. Date: Sep. 2, 2021

(65) Prior Publication Data
US 2023/0007885 A1  Jan. 12, 2023

Related U.S. Application Data

(60) Provisional application No. 62/982,544, filed on Feb. 27, 2020.

(51) Int. Cl.
*H01J 37/32* (2006.01)

(52) U.S. Cl.
CPC .. *H01J 37/32183* (2013.01); *H01J 37/32146* (2013.01); *H01J 37/32926* (2013.01);
(Continued)

(58) Field of Classification Search
None
See application file for complete search history.

(56) References Cited

U.S. PATENT DOCUMENTS 4,891,087 A * 1/1990 Davis ............... H01J 37/32532
204/298.31
8,962,488 B2 * 2/2015 Liao .................. H01J 37/32082
216/68

(Continued)

OTHER PUBLICATIONS

ISR & WO PCT/US2021/017098, dated Jun. 2, 2021, 8 pages.

*Primary Examiner* — Shamim Ahmed
(74) *Attorney, Agent, or Firm* — PENILLA IP, APC

(57) ABSTRACT

A method for achieving uniformity in an etch rate is described. The method includes receiving a voltage signal from an output of a match, and determining a positive crossing and a negative crossing of the voltage signal for each cycle of the voltage signal. The negative crossing of each cycle is consecutive to the positive crossing of the cycle. The method further includes dividing a time interval of each cycle of the voltage signal into a plurality of bins. For one or more of the plurality of bins associated with the positive crossing and one or more of the plurality of bins associated with the negative crossing, the method includes adjusting a frequency of a radio frequency generator to achieve the uniformity in the etch rate.

22 Claims, 13 Drawing Sheets

(52) U.S. Cl.
CPC ............... *H01J 2237/24564* (2013.01); *H01J 2237/3343* (2013.01)

(56) References Cited

U.S. PATENT DOCUMENTS

| | | |
|---|---|---|
| 9,136,095 B2 | 9/2015 | Mori et al. |
| 9,704,690 B2 | 7/2017 | Kim et al. |
| 2014/0195033 A1* | 7/2014 | Lyndaker .......... H01J 37/32183 700/121 |
| 2017/0372872 A1 | 12/2017 | Marakhtanov et al. |
| 2019/0333744 A1 | 10/2019 | Nagami et al. |
| 2019/0362941 A1 | 11/2019 | Kawasaki |
| 2020/0020510 A1* | 1/2020 | Shoeb ............... H01J 37/32183 |
| 2021/0319980 A1* | 10/2021 | Bhowmick ....... H01J 37/32128 |

* cited by examiner (Sheath Voltage)

(Binning before and after positive crossing)

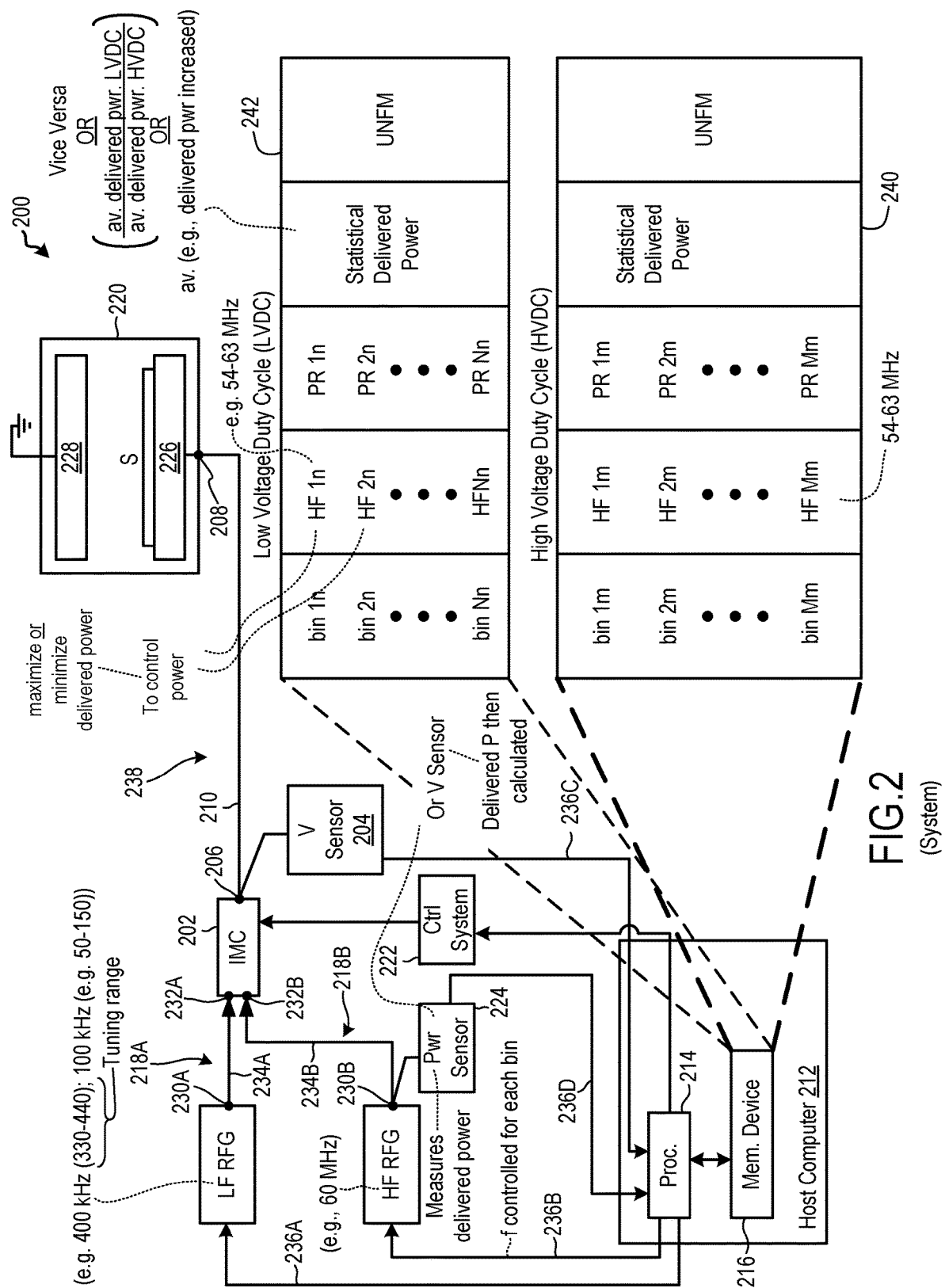
FIG.2 (System)

(HF RFG)

(IMC)

SYSTEMS AND METHODS FOR USING BINNING TO INCREASE POWER DURING A LOW FREQUENCY CYCLE

CLAIM OF PRIORITY

This application is a national stage filing of and claims priority, under 35 U.S.C. § 371, to PCT/US21/17098, filed on Feb. 8, 2021, and titled "SYSTEMS AND METHODS FOR USING BINNING TO INCREASE POWER DURING A LOW FREQUENCY CYCLE", which claims the benefit of and priority, under 35 U.S.C. § 119 (e), to U.S. Provisional Patent Application No. 62/982,544, filed on Feb. 27, 2020, and titled "SYSTEMS AND METHODS FOR USING BINNING TO INCREASE POWER DURING A LOW FREQUENCY CYCLE", all of which are incorporated by reference herein in their entirety.

FIELD

The present embodiments relate to systems and methods for using binning to increase power during a low frequency cycle.

BACKGROUND

A plasma tool includes a radio frequency generator (RFG), an impedance matching network, and a plasma chamber. The RFG generates power that is provided via the impedance matching network to the plasma chamber. When the power is being provided, a process gas is supplied to the plasma chamber for processing a wafer placed within the plasma chamber. When the process gas is supplied, plasma is generated within the plasma chamber. The wafer is etched by the plasma that is generated.

It is in this context that embodiments described in the present disclosure arise.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for using binning to increase power during a low frequency cycle. It should be appreciated that the present embodiments can be implemented in numerous ways, e.g., a process, an apparatus, a system, a device, or a method on a computer readable medium. Several embodiments are described below.

A low frequency (LF) radio frequency (RF) generator and a high frequency (HF) RF generator are used to process a substrate. The LF RF generator and the HF RF generators generate RF signals that are used to generate plasma and a plasma sheath within a plasma chamber. A voltage of the plasma sheath cycles between a low level and a high level. During a time period at which the plasma sheath is at the low level, a first voltage of the plasma sheath generated based on the HF RF generator has a greater amount of influence on a second voltage of the plasma sheath generated based on the LF RF generator. The influence is greater than an amount of influence of the first voltage on the second voltage during a time period at which the plasma sheath is at the high level. This increased influence makes it difficult to control uniformity in processing the substrate. The systems and methods described herein facilitate achieving the uniformity during the time period in which there is the increase in the amount of influence.

Some advantages of the herein described systems and methods include achieving a level of uniformity in processing of the substrate, such as an etch rate or a deposition rate of the substrate. The level of uniformity is achieved by dividing a portion of a cycle of a voltage measured at an output of an impedance matching circuit into a pre-determined number of bins. For example, a portion of the cycle between a positive crossing of the cycle and a negative crossing of the cycle is divided into the pre-determined number of bins. For each bin, a frequency of the HF RF generator is controlled to control power delivered by the HF RF generator. For example, the frequency of the HF RF generator is increased or decreased to increase the delivered power. The control of frequency for the pre-determined number of bins allows for detailed control of the HF RF generator to achieve the level of uniformity.

In one embodiment, a method for achieving uniformity in an etch rate is described. The method includes receiving a voltage signal from an output of a match, and determining a positive crossing and a negative crossing of the voltage signal for each cycle of the voltage signal. The negative crossing of each cycle is consecutive to the positive crossing of the cycle. The method further includes dividing a time interval of each cycle of the voltage signal into a plurality of bins. For one or more of the plurality of bins associated with the positive crossing and one or more of the plurality of bins associated with the negative crossing, the method includes adjusting a frequency of a radio frequency generator to achieve the uniformity in the etch rate.

In an embodiment, a method for achieving uniformity in an etch rate is described. The method includes receiving a voltage signal from an output of a match, and determining a positive crossing and a negative crossing of the voltage signal for each cycle of the voltage signal. The negative crossing of each cycle is consecutive to the positive crossing of the cycle. The method further includes dividing a time interval starting from a time proximate to the positive crossing and ending at a time proximate to the negative crossing of each cycle of the voltage signal into a plurality of bins. For one or more of the plurality of bins, the method includes adjusting a frequency of a radio frequency generator to achieve the uniformity in the etch rate.

In one embodiment, a controller for achieving uniformity in an etch rate is described. The controller includes a processor that receives a voltage signal from an output of a match. The processor determines a positive crossing and a negative crossing of the voltage signal for each cycle of the voltage signal. The negative crossing of each cycle is consecutive to the positive crossing of the cycle. The processor divides a time interval starting from a time proximate to the positive crossing and ending at a time proximate to the negative crossing of each cycle of the voltage signal into a plurality of bins. For one or more of the plurality of bins, the processor adjusts a frequency of a radio frequency generator to achieve the uniformity in the etch rate. The controller includes a memory device coupled to the processor.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1B-2 is a continuation of the graph of FIG. 1B-1.

FIG. 1D-1 is an embodiment of a graph to illustrate binning before and after a positive crossing.

FIG. 1D-2 is a continuation of the graph of FIG. 1D-1.

FIG. 2 is an embodiment of a plasma system to illustrate application of frequencies of operation of a high frequency (HF) RF generator for multiple bins.

DETAILED DESCRIPTION

The following embodiments describe systems and methods for using binning to increase power during a low frequency cycle. It will be apparent that the present embodiments may be practiced without some or all of these specific details. In other instances, well known operations have not been described in detail in order not to unnecessarily obscure the present embodiments.

Figure 1A:
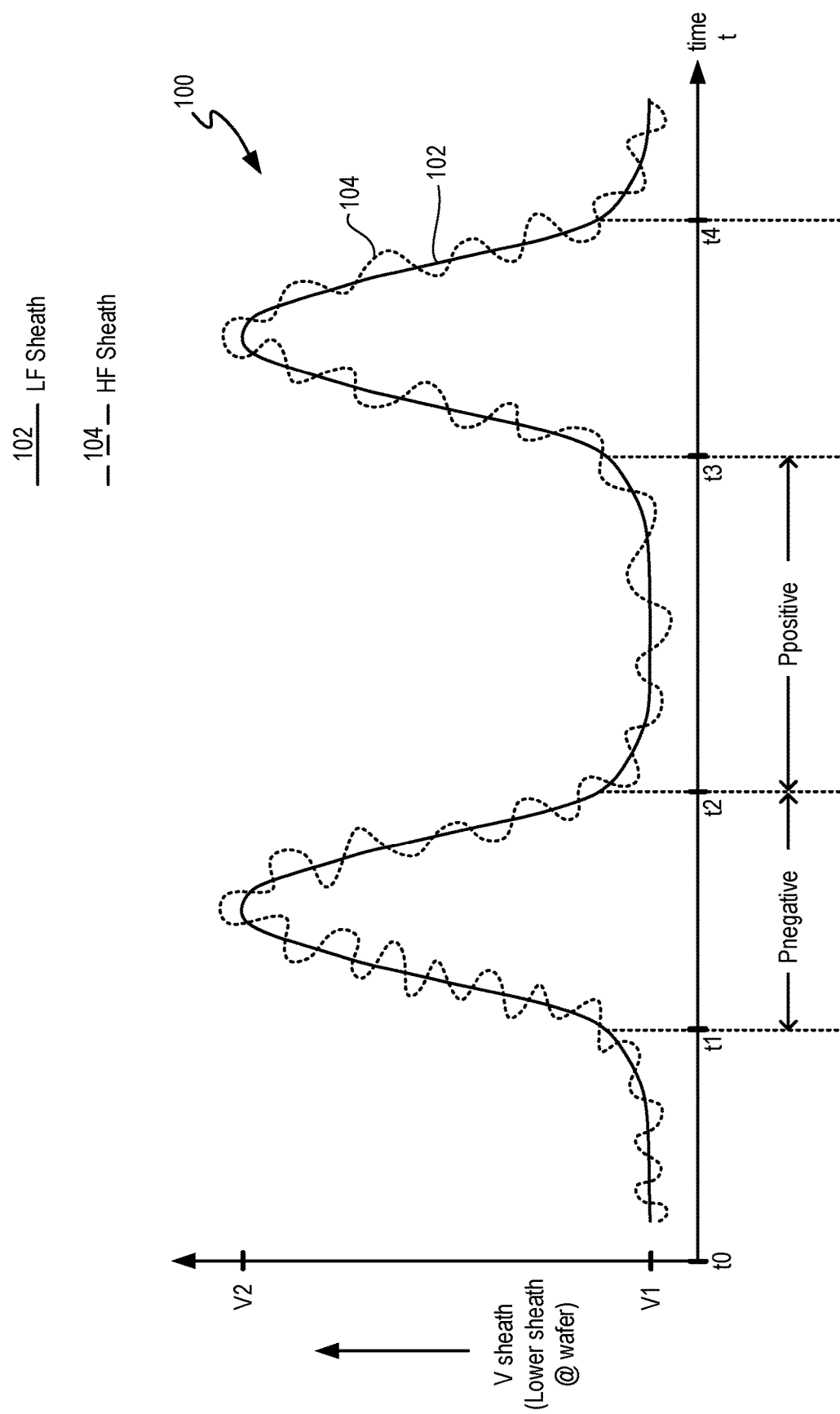
FIG. 1A is an embodiment of a graph to illustrate a voltage of a plasma sheath versus time.

FIG. 1A is an embodiment of a graph 100 and illustrate a voltage (V) of a plasma sheath versus time t. The plasma sheath is a bottom plasma sheath and the bottom plasma sheath is formed closer to a powered electrode, which is a lower electrode, compared to a top plasma sheath. The top plasma sheath is formed closer to an upper electrode compared to the bottom plasma sheath. The graph 100 plots the voltage of the plasma sheath on a y-axis and the time t on an x-axis. The graph 100 includes a plot 102 of a first portion of the voltage of the plasma sheath, and the first portion is created as a result of a radio frequency (RF) signal that is generated by a low frequency (LF) RF generator. Examples of the LF RF generator are provided below. The plot 102 is illustrated using a solid line. The graph 100 further includes a plot 104 of a second portion of the voltage of the plasma sheath, and the second portion is created based on an RF signal that is generated by a high frequency (HF) RF generator. Examples of the HF RF generator are provided below. The plot 104 is illustrated using a dashed line.

As illustrated in FIG. 1A, the plot 102 cycles between a low voltage level V1 and a high voltage level V2. An example of the low voltage level V1 is a low voltage point, such as a low voltage magnitude, and an example of the high voltage level V2 is a high voltage point, such as a high voltage magnitude. The plot 102 stays at a level that is approximately the low voltage level V1 from a time t0 until a time t1, transitions from the level at the time t1 to achieve the high voltage level V2 between the time t1 and a time t2, and transitions from the high voltage level V2 to achieve the level that is approximately the low voltage level V1 at the time t2. Also, the plot 102 is at the level that is approximately the low voltage level V1 from approximately the time t2 until a time t3, transitions from the level at the time t3 to achieve the high voltage level V2 between the time t3 and a time t4, and achieves the level that is approximately the low voltage level V1 at approximately the time t4. An example of the level that is approximately the low voltage level V1 is a level that is within a pre-determined range, such as within ±10%, from the low voltage level V1.

It should be noted that between the times t1 and t2, the plot 102 is either transitioning between the low voltage level V1 and the high voltage level V2 or is at the high voltage level V2. Because of the high voltage level V2, the plasma sheath is thick and there is a lower effect of the second portion of the voltage of the plasma sheath (plot 104) on the first portion of the voltage of the plasma sheath (plot 102). When the second portion of the voltage affects the first portion during a time period between the times t1 and t2, a voltage of the plasma sheath reaches the highest voltage point, such as the highest voltage magnitude. The highest voltage point is highest among all magnitudes of the voltage of the plasma sheath during a time period between the times t1 and t3. Due to the lower effect, generally, a uniformity level in an etch rate across a surface of a substrate is achieved. Also, control of an impedance matching network is sufficient between the times t1 and t2 to minimize power reflected towards the LF and HF RF generators from a plasma chamber via the impedance matching network. However, between the times t2 and t3, the level that is approximately the low voltage level V1 is maintained. Between the times t2 and t3, because of the low voltage level V1, the plasma sheath is thin and there is a greater effect of the second portion of the voltage of the plasma sheath (plot 104) on the first portion of the voltage of the plasma sheath (plot 102). When the second portion of the voltage affects the first portion during a time period between the times t2 and t3, a voltage of the plasma sheath reaches the lowest voltage point, such as the lowest voltage magnitude. The lowest voltage point is lowest among all magnitudes of the voltage of the plasma sheath during a time period between the times t1 and t3. As a result of the greater effect, there is a decrease in the uniformity in the etch rate. For example, an RF signal output from the HF RF generator creates harmonics within the plasma chamber and the harmonics creates standing waves. The standing waves decrease the uniformity in the etch rate.

Figures 1, 1B:
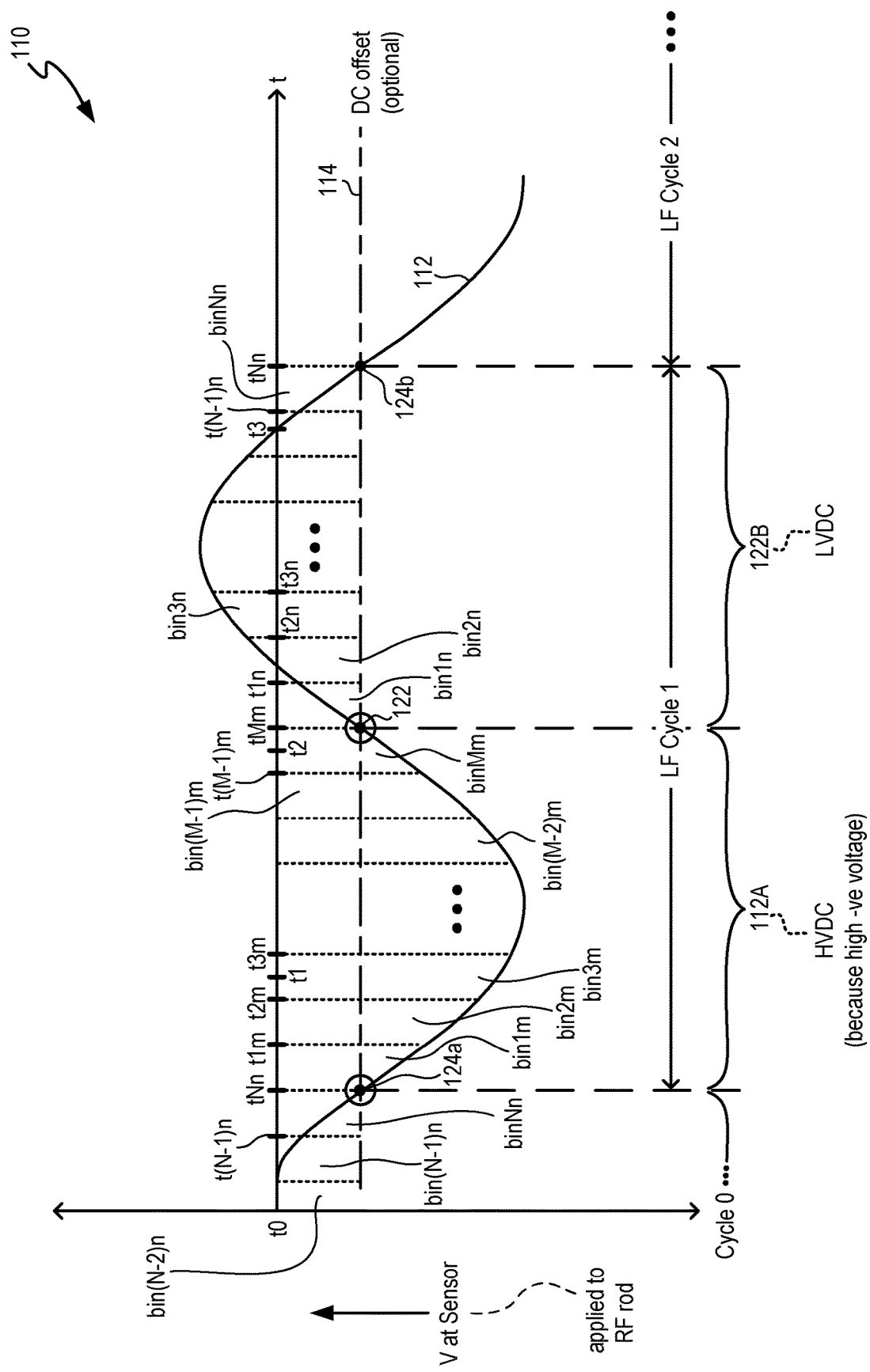
FIGS. 1B-1 is an embodiment of a graph to illustrate a voltage that is applied to a radio frequency (RF) rod of an RF transmission line to achieve the voltage illustrated in FIG. 1A at the plasma sheath.
Figures 1, 1B, 2:
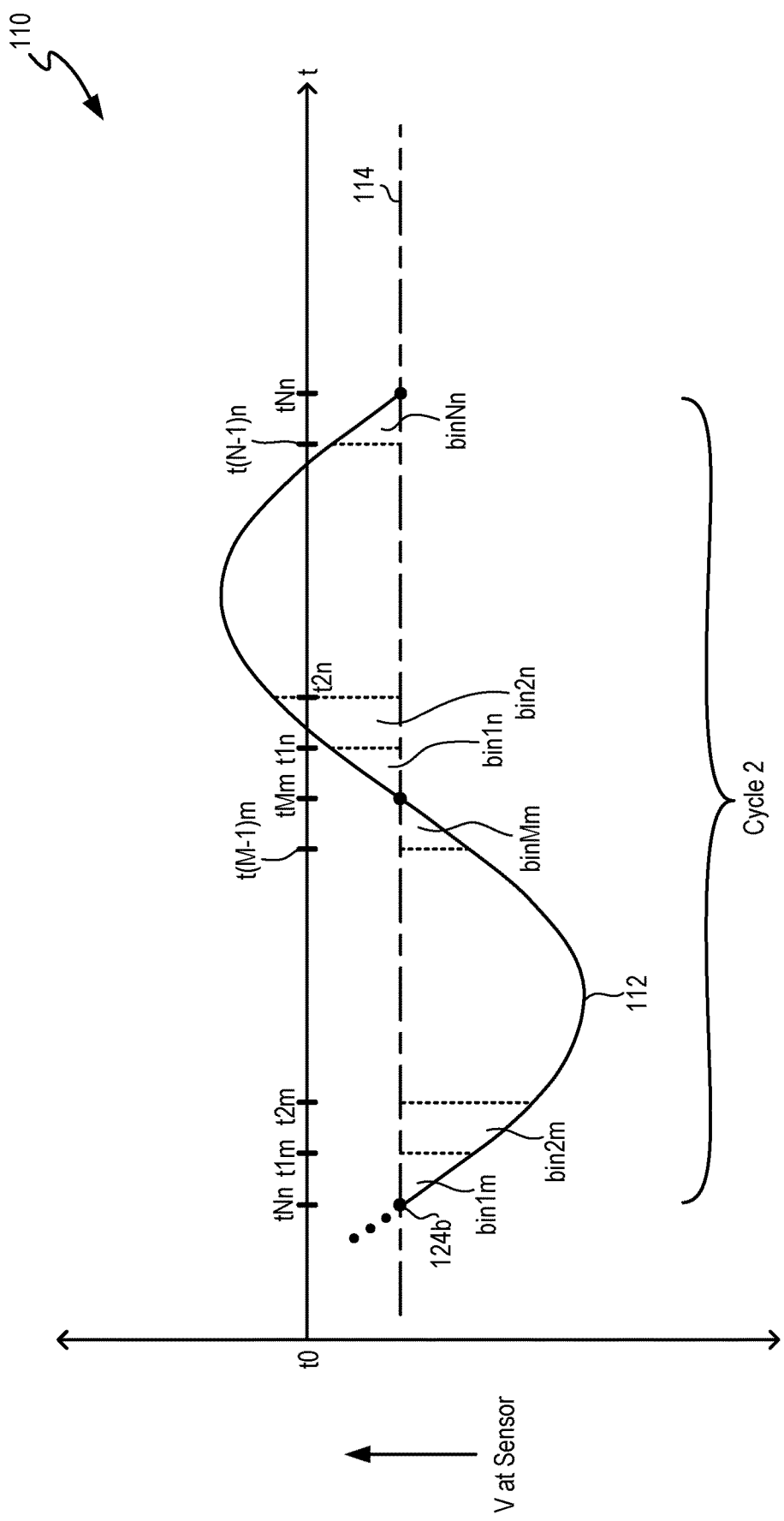

FIG. 1B-1 is an embodiment of a graph 110 to illustrate a voltage 112 that is applied to a radio frequency (RF) rod of an RF transmission line to achieve the voltage illustrated in FIG. 1A at the plasma sheath. FIG. 1B-2 is a continuation of the graph 110. The graph 110 plots the voltage 112 that is measured by a sensor, which is coupled to an output of an impedance matching circuit (IMC), which is illustrated with respect to FIG. 2. The voltage 112 is plotted versus the time t that is illustrated in FIG. 1A. The voltage 112 is plotted on a y-axis and the time t is plotted on an x-axis. The voltage 112 is a voltage signal that repeats over multiple cycles, such as a cycle 1 and a cycle 2. The cycle 2 is consecutive to the cycle 1. As an example, the voltage signal of the graph 110 is a sinusoidal signal.

The voltage 112 has or is applied a direct current (DC) offset 114. The DC offset 114 is applied by the impedance matching circuit and a blocking capacitor (not shown) of a plasma system described herein.

The voltage 112 has a positive crossing for each cycle of the voltage 112 and a negative crossing for each cycle of the voltage 112. For example, the voltage 112 has a positive crossing 122 during the cycle 1 and a negative crossing 124a during the cycle 1. The positive crossing 124a indicates a start of the cycle 1. The positive crossing of each cycle of the voltage 112 is consecutive to the negative crossing of the cycle. For example, there are no other crossings between the positive crossing 122 and the negative crossing 124a of the cycle 1. The positive and negative crossings are further described below.

A negative crossing of a cycle is at a start of the cycle and at an edge of the cycle. For example, the cycle 1 has the negative crossing 124a, which indicates a beginning of the cycle 1, and has another negative crossing 124b, which indicates an end of the cycle 1. The other negative crossing 124b, which is consecutive to the positive crossing 122 of the cycle 1, belongs to the cycle 1 of the voltage 112. The other negative crossing 124b is at an edge of the cycle 1. Also, the negative crossing 124b at the end of the cycle 1 belongs to the cycle 2.

Each cycle of the voltage 112 is divided by a processor, which is described below with reference to FIG. 2, into multiple bins, such as segments or divisions or divided time intervals. For example, a first half 112A of a time period of the cycle 1 is divided into bins 1m, 2m, and so on until bin Mm, where M is an integer and m is a variable that indicates a first half of each cycle of the voltage 112. Also, a second half 112B of the time period of the cycle 1 is divided into bins 1n, 2n, and so on until bin Nn, where N is an integer and n is a variable that indicates a second half of each cycle of the voltage 112. As another example, with reference to FIG. 1B-2, a first half of a time period of the cycle 2 is divided into bins 1m, 2m, and so on until the bin Mm. Also, a second half of the time period of the cycle 2 is divided into bins 1n, 2n, and so on until the bin Nn.

Each bin of the cycle 1 has the same time period or time interval. For example, the bin 1m of the cycle 1 extends from a time tNn at the end of a cycle 0 until a time t1m of the cycle 1, the bin 2m of the cycle 1 extends from the time t1m of the cycle 1 to a time t2m of the cycle 1, and the bin Mm of the cycle 1 extends from a time t(M−1)m of the cycle 1 to a time tMm of the cycle 1. The cycle 1 is consecutive to the cycle 0 of the voltage 112. A time interval between the time Nn of the cycle 0 and the time t1m of the cycle 1 is equal to a time interval between the time t1m of the cycle 1 and the time t2m of the cycle 1 and is equal to a time interval between the time t(M−1)m of the cycle 1 and the time tMm of the cycle 1. Similarly, the bin 1n of the cycle 1 extends from the time tMm of the cycle 1 until a time t1n of the cycle 1, the bin 2n of the cycle 1 extends from the time t1n of the cycle 1 to a time t2n of the cycle 1, and the bin Nn extends from a time t(N−1)n of the cycle 1 to a time tNn, which is a time at the end of the cycle 1 and at the start of the cycle 2. A time interval between the time tMm of the cycle 1 and the time t1n of the cycle 1 is equal to a time interval between the time t1n of the cycle 1 and the time t2n of the cycle 1 and is equal to a time interval between the time t(N−1)n of the cycle 1 and the time tNn, which is a time at the end of the cycle 1 and at the start of the cycle 2.

Similarly, each bin of each remaining cycle, such as the cycle 2, of the voltage 112 has the same time period or time interval. For example, the bin 1m of the cycle 2 extends from the time tNn of the cycle 2 until a time t1m of the cycle 2, the bin 2m of the cycle 2 extends from the time t1m of the cycle 2 to a time t2m of the cycle 2, and the bin Mm of the cycle 2 extends from the time t(M−1)m of the cycle 2 to the time tMm of the cycle 2. In a similar manner, the bin 1n of the cycle 2 extends from the time tMm of the cycle 2 until the time t1n of the cycle 2, the bin 2n of the cycle 2 extends from the time t1n of the cycle 2 to the time t2n of the cycle 2, and the bin Mm extends from the time t(N−1)n of the cycle 2 to the time tNn, which is a time at the end of the cycle 2 and at the start of a cycle 3 of the voltage 112. The cycle 3 is consecutive to the cycle 2 of the voltage 112.

As illustrated by the plot 102 and the voltage 112 of FIGS. 1A, 1B-1 and 1B-2, during a time period between the time t1 and the time t2 in which the voltage 112 is high, e.g., is largely negative, there is an increase in the voltage of the plasma sheath. Also, during a time period between the time t2 and the time t3 in which the voltage 112 is low, e.g., has a small positive potential or is not largely negative, there is a decrease in the voltage of the plasma sheath. As an example, the high amount of the voltage 112 is more negative compared to the low amount of the voltage 112. To illustrate, the high amount of the voltage 112 has negative magnitudes that are larger than magnitudes of the low amount of the voltage 112. To further illustrate, the high amount of the voltage 112 does not have a positive potential and the low amount of the voltage 112 has a positive potential. The low voltage 112 corresponds to $P_{positive}$, which indicates a relatively positive amount of power associated with the low voltage. The relatively positive amount of power during the time period between the times t2 and t3 is more positive compared to an amount of power that is based on the voltage 112 between the times t1 and t2. The amount of power between the times t1 and t2 is relatively negative compared to the amount of power between the times t2 and t3. The relatively negative amount of power between the times t1 and t2 is illustrated as $P_{negative}$.

Also, the voltage 112 between the times t1 and t2 represents a high voltage duty cycle (HVDC) of the voltage 112 and the voltage 112 between the times t2 and t3 represents a low voltage duty cycle (LVDC) of the voltage 112. The high voltage is more negative compared to the low voltage.

As further illustrated by the plot 102 and the voltage 112 of FIGS. 1A, 1B-1 and 1B-2, a second half of each cycle of the voltage 112 coincides with a time period during which a voltage of the plasma sheath is lower compared to a voltage of the plasma sheath during a first half of the cycle, and a first half of each cycle of the voltage 112 coincides with a time period during which a voltage of the plasma sheath is greater compared to the voltage of the plasma sheath during second half of the cycle. For example, the second half 112B coincides with a time period between the times t2 and t3 during which a voltage of the plasma sheath is lower compared to a voltage of the plasma sheath during the first half 112A, and the first half 112A coincides with a time period between the times t1 and t2 during which a voltage of the plasma sheath is greater compared to the voltage of the plasma sheath during the second half 112B. To further illustrate, a time period between the times t1 and t2 of the plot 102 is encompassed within a time period of occurrence of the first half 112A of the cycle 1 of the voltage 112 and a majority of a time period between the times t2 and t3 of the plot 102 is encompassed within a time period of occurrence of the second half 112B of the cycle 1 of the voltage 112.

During each bin of the first half 112A of the cycle 1, the processor determines a frequency of operation of the HF RF generator to control an amount of power that is delivered at an output of the HF RF generator. For example, during the time interval of the bin 1m of the cycle 1, the processor determines the frequency of operation of the HF RF generator for which the amount of power delivered at the output of the HF RF generator increases or decreases or is maintained to achieve a pre-determined level of uniformity. The amount of power delivered increases or decreases or is maintained compared to an amount of power delivered at the output of the HF RF generator during the bin 1m of a preceding cycle, such as the cycle 0, of the voltage 112. As another example, during the time interval of the bin 2m of the cycle 1, the processor determines the frequency of operation of the HF RF generator for which the amount of power delivered at the output of the HF RF generator increases or decreases or is maintained to achieve the pre-determined level of uniformity. The amount of power delivered increases or decreases or is maintained compared to an amount of power delivered at the output of the HF RF generator during the bin 2m of a preceding cycle, such as the cycle 0, of the voltage 112.

During the cycle 2 of the voltage 112, the processor applies the frequencies of operation that are previously determined during the first half of the cycle 1 of the voltage 112. For example, the processor increases or decreases the frequency of operation of the HF RF generator during the bin 1m of the cycle 2 to achieve the frequency that is previously determined during the bin 1m of the cycle 1. As another example, the processor increases or decreases the frequency of operation of the HF RF generator during the bin 2m of the cycle 2 to achieve the frequency that is previously determined during the bin 2m of the cycle 1.

In a similar manner, during each bin of the second half 112B of the cycle 1, the processor determines a frequency of operation of the HF RF generator to control an amount of power that is delivered at an output of the HF RF generator. For example, during the time interval of the bin 1n of the cycle 1, the processor determines the frequency of operation of the HF RF generator for which the amount of power delivered at the output of the HF RF generator increases or decreases or remains the same. The amount of power delivered increases or decreases or is maintained compared to an amount of power delivered at the output of the HF RF generator during the bin 1n of a preceding cycle, such as the cycle 0, of the voltage 112. As another example, during the time interval of the bin 2n of the cycle 1, the processor determines the frequency of operation of the HF RF generator for which the amount of power delivered at the output of the HF RF generator increases or decreases or stays the same. The amount of power delivered increases or decreases or is maintained compared to an amount of power delivered at the output of the HF RF generator during the bin 2n of a preceding cycle, such as the cycle 0, of the voltage 112.

During the cycle 2 of the voltage 112, the processor applies the frequencies of operation that are previously determined during the second half 112B of the cycle 1 of the voltage 112. For example, the processor increases or decreases the frequency of operation of the HF RF generator during the bin 1n of the cycle 2 to achieve the frequency that is previously determined during the bin 1n of the cycle 1. As another example, the processor increases or decreases the frequency of operation of the HF RF generator during the bin 2n of the cycle 2 to achieve the frequency that is previously determined during the bin 2n of the cycle 1.

It should be noted that it is more beneficial to control the frequency of operation during the second half of the cycle 2 compared to the first half of the cycle 2. This is because the low voltage of the plasma sheath between the times t2 and t3 results in the decrease in the uniformity in the etch rate. By controlling the frequency of operation during the second half of the cycle 2, the delivered power at the output of the HF RF generator is increased and the uniformity is increased.

In one embodiment, the first half 112A of the time period of the cycle 1 is divided into a different number of bins than the second half 112B of the time period of the cycle 1. For example, the first half 112A of the time period of the cycle 1 is divided into 10 bins and the second half 112B of the time period of the cycle 1 is divided into 15 bins.

In an embodiment, the processor controls the frequency of operation of the HF RF generator during a second half of each cycle, such as the cycles 2 and 3, after the cycle 1 of the voltage 112 but does not control the frequency of operation of the HF RF generator during a first half of the cycle of the voltage 112. For example, the processor controls the frequency of operation in a second half of the cycle 2 but does not control the frequency in a first half of the cycle 2. To illustrate, the processor does not control the frequency of operation when the processor ignores the pre-determined level of uniformity. To further illustrate, the processor does not target the pre-determined level of uniformity while adjusting the frequency of operation. As another illustration, the processor does not modify the frequency of operation to not control the frequency of operation.

In one embodiment, the processor controls the frequency of operation of the HF RF generator during a first half of each cycle of the voltage 112 but does not control the frequency of operation of the HF RF generator during the second half of the cycle. For example, the processor controls the frequency of operation of the HF RF generator during the first half 112A of the cycle 1 of the voltage 112 but does not control the frequency of operation of the HF RF generator during the second half 112B of the cycle 1 of the voltage 112. As another example, the processor controls the frequency of operation of the HF RF generator during the first half 112A of the cycle 2 of the voltage 112 but does not control the frequency of operation of the HF RF generator during the second half 112B of the cycle 2 of the voltage 112.

In an embodiment, the processor determines the frequency of operation of the HF RF generator for a bin of the voltage 112 during multiple cycles of the voltage 112 and applies the frequency of operation during a consecutively following cycle of the voltage 112. The consecutively following cycle is consecutive to the multiple cycles of the voltage 112. For example, the processor determines the frequency of operation of the HF RF generator during the bin 1n of multiple cycles, such as the cycles 1 and 2, of the voltage 112, and controls the HF RF generator to achieve the same frequency of operation during the bin 1n of a cycle 3 of the voltage 112. The cycle 3 is consecutive to the cycle 2.

It should be noted that in one embodiment, the frequency of operation of the HF RF generator changes for the same bin after a first set of cycles of the voltage 112 and the change in the frequency of operation is calculated based on achieving a level of uniformity. Once the frequency changes, the processor maintains the frequency constant for the same bin for a second set of cycles. The first set of cycles precedes the second set of cycles.

In one embodiment, the processor applies the frequency of operation of the HF RF generator determined for a bin during a cycle of the voltage 112 to the same bin during multiple consecutive cycles of the voltage 112. For example, the processor applies the frequency of operation of the HF RF generator determined for the bin 1n during the cycle 1 of the voltage 112 to the bin 1n during the cycles 2 and 3 of the voltage 112.

In an embodiment, the processor determines the frequency of operation of the HF RF generator for a bin during a cycle of the voltage 112 and then applies this determined frequency of operation to the bin during the same cycle. For example, the frequency of operation is determined during a portion of the bin 1n of the cycle 1 and applied during the remaining portion of the bin 1n of the cycle 1.

In an embodiment, the DC offset 114 is not applied to the voltage 112 and the voltage 112 oscillates with respect to the x-axis on which the time t is plotted. For example, a voltage of the DC offset 114 is zero.

Although the voltage 112 illustrated in FIG. 1B-1 has a sinusoidal form or envelope, in one embodiment, the voltage 112 has another shape, e.g., a saw tooth shape, or a pulsed shape, or an arbitrary shape.

Figure 1C:
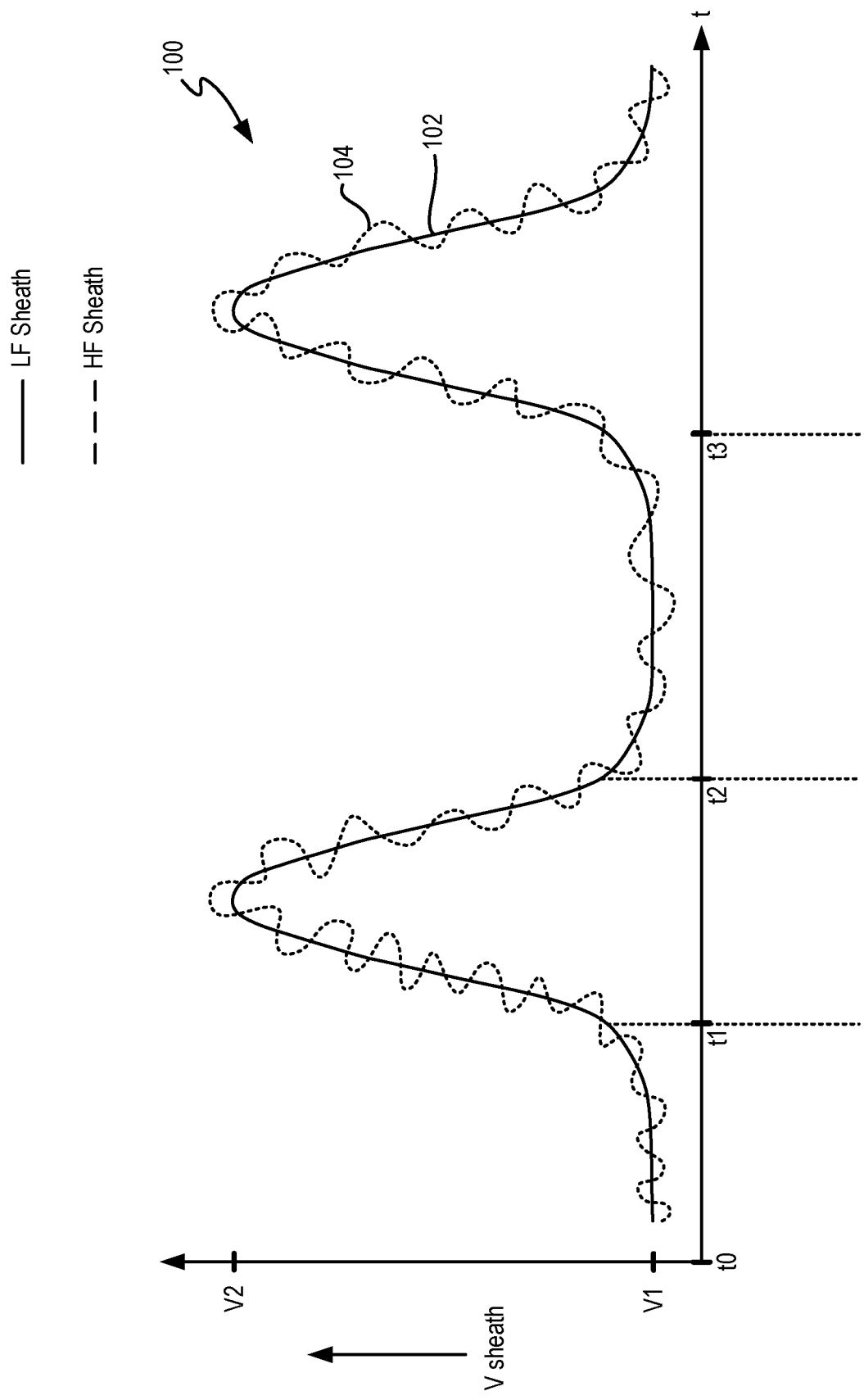
FIG. 1C is an embodiment of the graph of FIG. 1A.

FIG. 1C is an embodiment of the graph 100.

Figures 1, 1D:
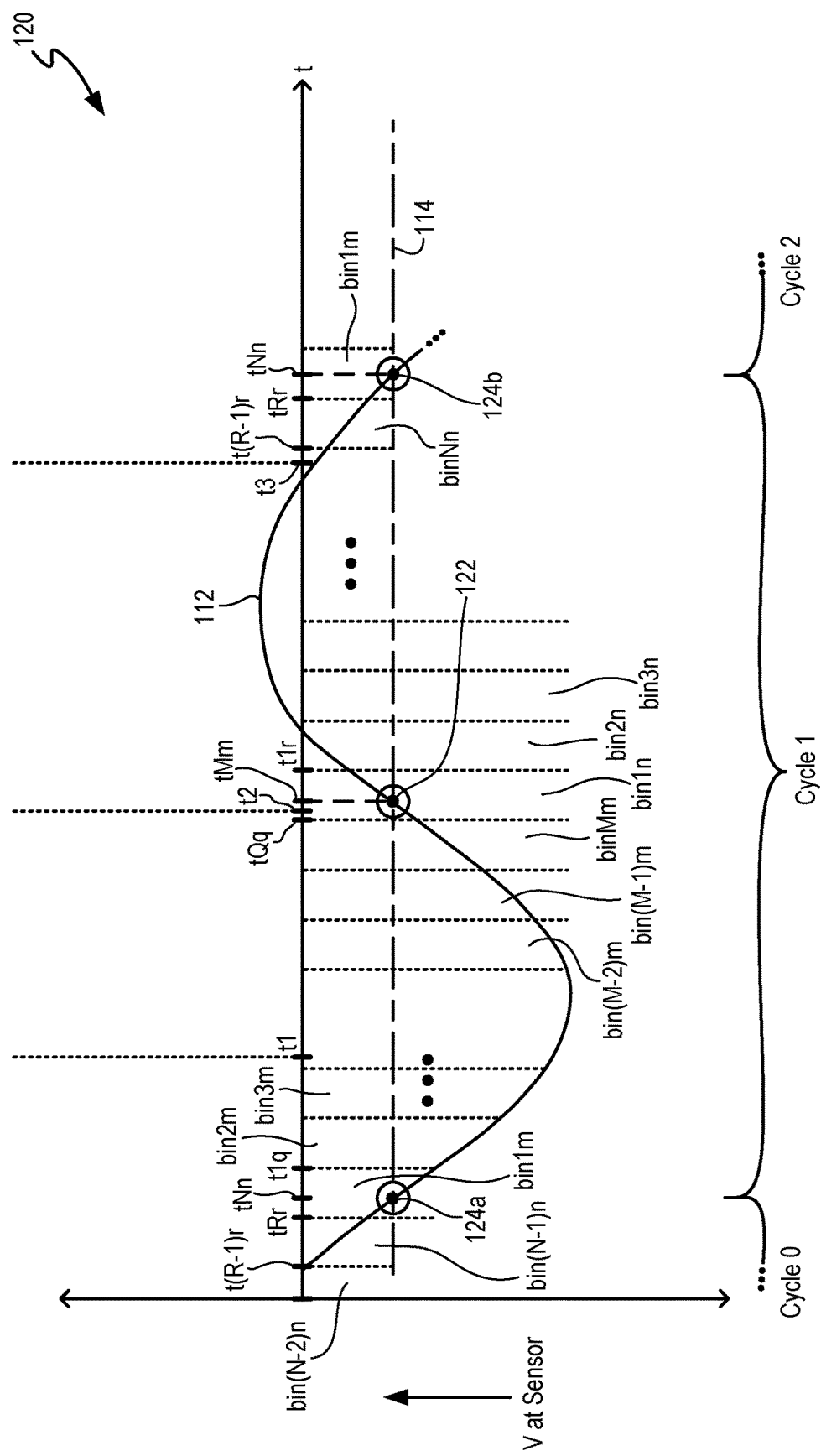
Figures 1, 1D, 2:
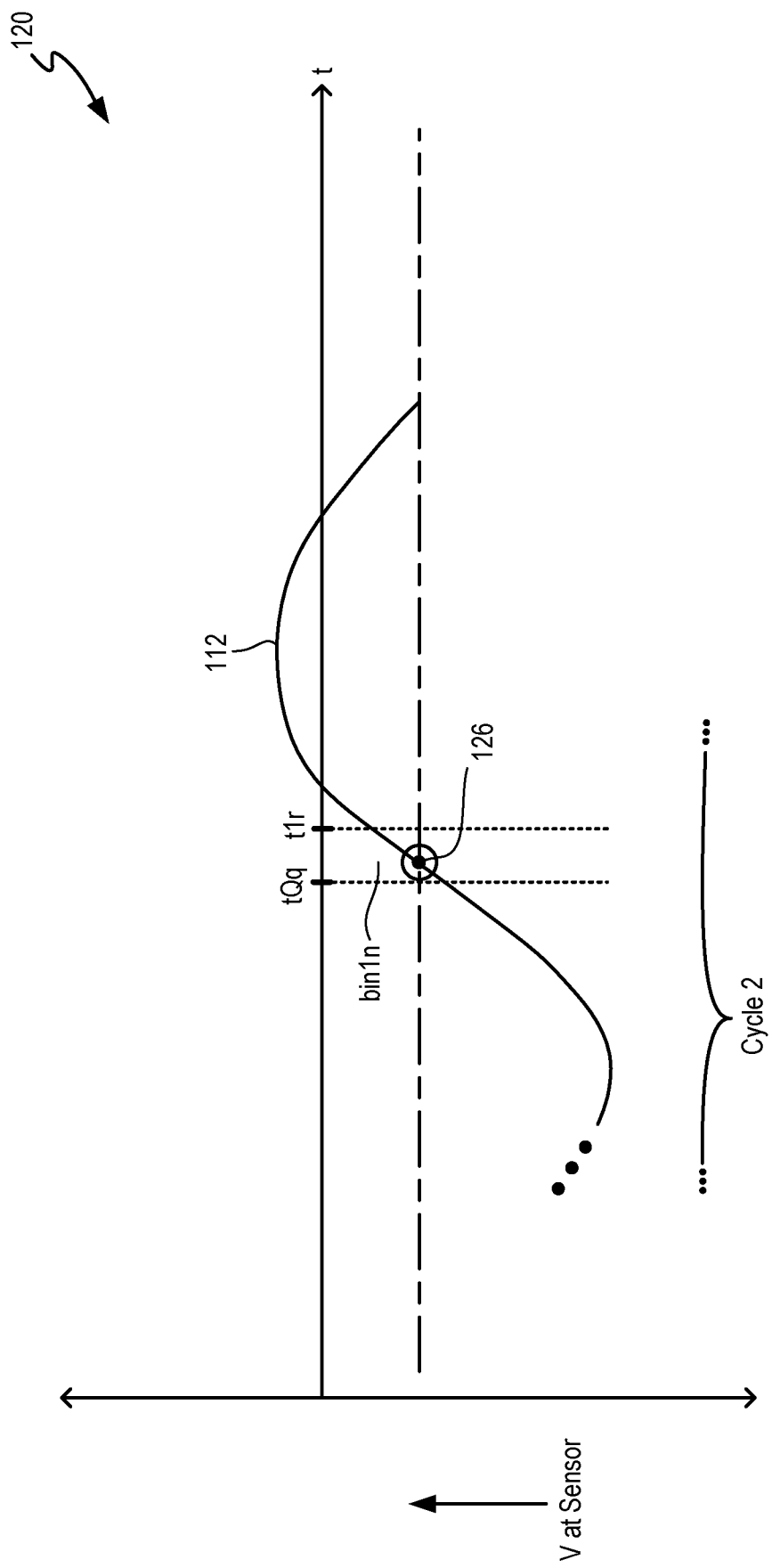

FIG. 1D-1 is an embodiment of a graph 120 to illustrate binning before and after the positive crossing 122 of a cycle of the voltage 112. FIG. 1D-2 is a continuation of the graph 120. A positive crossing is a crossing of the voltage 112 from a more negative potential on one side of the DC offset 114 to a less negative potential on an opposite side of the DC offset 114. As an example, the positive crossing is a point in time at which a value of the voltage 112 matches a potential of the DC offset 114 and the voltage 112 transitions from the more negative potential to the less negative potential. The positive crossing 122 occurs at the time tMm or approximately at the time tMm during each cycle of the voltage 112. An example of a time that is approximately at the time tMm is a time that is within a pre-set range, such as ±10%, from the time tMm. The graph 120 plots the voltage 112 versus the time t. The voltage 112 is plotted on a y-axis of the graph 120 and the time t is plotted on an x-axis of the graph 120.

A negative crossing, such as the negative crossing 124a or 124b, is a crossing of the voltage 112 from a less negative potential on one side of the DC offset 114 to a more negative potential on an opposite side of the DC offset 114. As an example, the negative crossing is a point in time at which a value of the voltage 112 matches a potential of the DC offset 114 and the voltage 112 transitions from the less negative potential to the more negative potential. The negative crossing, such as the negative crossing 124a or 124b, occurs at the time tNn or approximately at the time tNn during each cycle of the voltage 112. An example of a time that is approximately at the time tNn is a time that is within a pre-set range, such as ±10%, from the time tNn.

The voltage 112 is divided into the bins 1m through 1n in a similar manner as that described above except that the bins 1m through 1n are offset along the x-axis so that the bin 1n of each cycle of the voltage 112 extends before and after the positive crossing 122 of the cycle and the bin 1m of the cycle extends before and after the negative crossing, such as the negative crossing 124a or 124b, of the cycle. For example, the bins 1m through 1n are shifted to the left compared to the bins 1m through 1n illustrated in FIG. 1B-1. The bin 1m starts at a time tRr of a preceding cycle, such as the cycle 0, and ends at a time t1q of a current cycle, such as the cycle 1, where R is an integer and r is a variable indicating a second half of each cycle of the voltage 112. The time tNn of the current cycle is between the time tRr of the preceding cycle and the time t1q of the current cycle. The preceding cycle precedes the current cycle. Moreover, the bin 1n starts at a time tQq of the current cycle and ends at a time t1r of the current cycle, where Q is an integer and q is a variable indicating a first half of each cycle of the voltage 112. The time tMm of the current cycle is between the time tQq of the current cycle and the time t1r of the current cycle.

The graph 120 plots the voltage 112 versus the time t. Instead of binning, such as dividing, each cycle of the voltage 112 into the bins 1m through Nn such that the bin 1m starts at a negative crossing of a cycle and the bin Nn ends at a positive crossing of a cycle (FIG. 1B-1), the processor divides the cycle of the voltage 112 into the bins 1m through Nn such that the bin 1n extends for a first pre-determined interval before the positive crossing 122 and for a second pre-determined time interval after the positive crossing 122 and the bin 1m extends for a third pre-determined time interval before the negative crossing 124a and for a fourth pre-determined time interval after the negative crossing 124a.

In other words, the positive crossing 122 and the negative crossing 124a do not happen at the edge (i.e., either the start or the end) of a bin, but instead happen within a mid-section of a bin. For example, the processor divides a time interval around the negative crossing 124a of the cycle 1 to generate the bin 1m of the cycle 1. To illustrate, the bin 1m of the cycle 1 extends from the third pre-determined time interval before the time tNn of the cycle 1 at which the negative crossing occurs 124a until the fourth pre-determined time interval after the time tNn. The time tRr is at the third pre-determined time interval before the time tNn and falls within the cycle 0 of the voltage 112, and the time t1q is at the fourth pre-determined interval after the time tNn and falls within the cycle 1 of the voltage 112. In one illustration, the third pre-determined time interval is equal to the fourth pre-determined time interval. As another illustration, the third pre-determined time interval is greater than or less than the fourth pre-determined time interval. As yet another illustration, each of the first pre-determined time interval, the second pre-determined time interval, the third pre-determined time interval and the fourth pre-determined time interval are equal. The processor determines a frequency of operation of the HF RF generator for the bin 1m and controls the frequency of operation of the HF RF generator to achieve the determined frequency of operation during the bin 1m of the cycle 2 of the voltage 112.

As another example, instead of dividing the first half 112A of the cycle 1 of the voltage 112 into a pre-set number of bins 1m through Mm using the positive and negative crossings 122 and 124a as end points, the processor divides a portion of the cycle 0 of the voltage 112, the first half 112A of the cycle 1, and a portion of the second half 112B of the cycle 1 into a pre-set number of the bins 1m through 1n. To illustrate, instead of ending the bin Mm at the time tMm, which is an end of the first half 112A of the cycle 1, the bin 1n starts at the first pre-determined interval before the time tMm and ends at the second pre-determined interval after the time tMm. In this illustration, the first pre-determined time interval is equal to the second pre-determined time interval. As another illustration, the first pre-determined time interval is greater than or less than the second pre-determined time interval. The bin 1n starts at the time tQq and ends at the time t1r. The time t1r is within the cycle 1 and the time tQq is within the cycle 1. Also, the time tQq occurs after the time t(M−1)m (FIG. 1B-1) of the cycle 1 and the time t1r occurs before the time t1n (FIG. 1B-1) of the cycle 1. Because the time tQq occurs after the time t(M−1)m (FIG. 1B-1) and the time t1r occurs before the time t1n, the positive crossing 122 occurs during a time period of the bin 1n instead of at a beginning or an end of a bin.

This allows the processor to control the frequency of operation of the HF RF generator during a time interval in which the positive crossing 122 occurs. For example, upon determining the frequency of operation of the HF RF generator for the bin 1n of the cycle 1, the processor applies the frequency of operation during the bin 1n of the cycle 2 of the voltage 112. The bin 1n of the cycle 2 extends from the time tQq of the cycle 2 until the time t1r of the cycle 2. During the bin 1n of the cycle 2 of the voltage 112, the positive crossing 122 occurs and the frequency of operation of the HF RF generator is controlled by the processor 214 at the positive crossing 112.

As another example, instead of dividing the second half 112B of the cycle 1 of the voltage 112 into a pre-set number of bins 1n through Nn such that the bin 1n starts at the positive crossing 122 of the cycle 1 and the bin Nn ends at the negative crossing 124b of the cycle 2, the processor divides a portion of the first half 112A of the cycle 1 of the voltage 112, the second half 112B of the cycle 1, and a portion of the first half 112A of the cycle 2 into a pre-set number of bins 1n through Nn. To illustrate, the bin 1n starts at the first pre-determined interval before the time tMm and ends at the second pre-determined interval after the time tMm.

In a similar manner, the processor divides a time interval around the negative crossing 124b of the cycle 2 to generate the bin 1m of the cycle 2. As an example, the bin 1m of the cycle 2 extends from the third pre-determined time interval before the time tNn of the cycle 1 at which the negative crossing occurs 124b until the fourth pre-determined time interval after the time tNn.

FIG. 2 is an embodiment of a plasma system 200 to illustrate application of the frequencies of operation of the HF RF generator for multiple bins. The plasma system 200 includes the LF RF generator, the HF RF generator, and impedance matching circuit (IMC) 202, a host computer 212, a plasma chamber 220, a voltage sensor 204, a control system 222, and a power sensor 224. The LF RF generator is a radiofrequency generator that operates in a low frequency range, e.g., a kilohertz (kHz) frequency range. For example, the LF RF generator is a 400 kHz RF generator that has a frequency tuning range from 330 kHz to 440 kHz. As another example, the LF RF generator is a 100 kHz RF generator that has a frequency tuning range from 50 kHz to 150 kHz. The HF RF generator is a radio frequency generator that operates in a high frequency range, e.g., a megahertz (MHz) frequency range. As an example, the HF RF generator is a 60 MHz RF generator that has a frequency tuning range from 54 MHz to 63 MHz. As another example, the HF RF generator operates at a frequency ranging from 20 MHz to 30 MHz or at a frequency ranging from 12 MHz to 14 MHz or at a frequency ranging from 1 MHz to 3 MHz.

An example of the IMC 202 includes a network of electrical components, such as capacitors and inductors. For example, the IMC 202 includes multiple inductors and multiple capacitors and the inductors and capacitors are coupled to each other. Examples of the capacitors include fixed capacitors and variable capacitors, and examples of the inductors include fixed inductors and variable inductors. The IMC 202 has two branch circuits including a first branch circuit and a second branch circuit.

The host computer 212 includes a processor 214 and a memory device 216. The processor 214 is coupled to the memory device 216. As an example, a processor is a controller, or an application specific integrated circuit (ASIC), or a programmable logic device (PLD), or a central processing unit (CPU), or a microcontroller, or a microprocessor, and these terms are used interchangeably herein. Examples of a memory device, as used herein, include a random access memory (RAM), a read-only memory (ROM), and a combination thereof.

An example of the control system 222 includes a combination of a driver system and a motor system. The driver system includes one or more drivers, such as one or more transistors, and the motor system includes one or more motors, such as one or more electric motors. The driver system is coupled to the motor system and the motor system is coupled to the IMC 202 via one or more connections, such as one or more rods or a combination of multiple rods and one or more gears. For example, an electrical motor is coupled to a plate of a capacitor of the IMC 202 via two rods and a gear, and the gear is coupled between the two rods.

The processor 214 is coupled to the LF RF generator via a transfer cable 236A and is coupled to the HF RF generator via another transfer cable 236B. As an example, the processor 214 is connected to a digital signal processor (DSP) of the LF RF generator via the transfer cable 236A and is connected to a DSP of the HF RF generator via the transfer cable 236B. Examples of a transfer cable include a serial transfer cable, a parallel transfer cable, and a Universal Serial Bus (USB) cable.

The processor 214 is also coupled via a transfer cable 236C to the voltage sensor 204, and is coupled via a transfer cable 236D to the power sensor 224. The processor 214 is also coupled to the driver system of the control system 222.

The plasma chamber 106 is a capacitively coupled plasma (CCP) chamber and includes a chuck 226 and an upper electrode 228. The upper electrode 228 has a lower surface faces an upper surface of the chuck 226. An example of the chuck 226 is an electrostatic chuck (ESC). The chuck 226 includes a lower electrode, which is made from a metal, such as aluminum or an alloy of aluminum. The upper electrode 228 is coupled to a ground potential and is made from silicon.

An output 230A of the LF RF generator is coupled to an input 232A of the IMC 202 via an RF cable 234A. The input 232A is coupled to the first branch circuit of the IMC 202. Moreover, an output 230B of the HF RF generator is coupled to another input 232B of the IMC 202 via another RF cable 234B. The input 232B is coupled to the second branch circuit of the IMC 202. The first and second branch circuits of the IMC 202 are coupled to each other at a connection point and the connection point is coupled to an output 206 of the IMC 202. As an example, the output 206 is an output port of a housing or of an enclosure of the IMC 202 and the RF transmission line 210 extends out of the match from the output port. The output 206 of the IMC 202 is coupled via an RF transmission line 210 and an input 208 of the plasma chamber 220 to the lower electrode of the chuck 226. The input 208 is a point on the RF transmission line 210. To illustrate, the input 208 is a port of a housing or of an enclosure of the plasma chamber 220 and the RF transmission line 210 extends into the housing or into the enclosure from the port. An example of the RF transmission line 210 includes an RF rod and an RF cylinder. The RF rod is coupled to the RF cylinder, which is located within the plasma chamber. The RF rod is surrounded by an RF tunnel of the RF transmission line 210 and an RF sheath of the RF transmission line 210. The RF sheath surrounds the RF tunnel, which includes an insulator material to insulate the RF rod from the RF sheath.

The power sensor 224 is coupled to the output 230B of the HF RF generator and the voltage sensor 204 is coupled to the output 206 of the IMC 202. For example, the power sensor 224 is coupled to the output 230B of an HF power supply of the HF RF generator and the voltage sensor 204 is coupled to the connection point of the first and second branch circuits of the IMC 202. The power sensor 224 measures delivered power, which is a difference between power supplied at the output 230B and power reflected towards the output 230B. The power reflected towards the output 230B is reflected from the plasma chamber 220 via the RF sheath and a housing of the IMC 202, an RF sheath of the RF cable 234B, and the output 230B towards the HF RF generator.

The processor 214 provides setpoints of parameters, such as frequency and power, via the transfer cable 236A to the LF RF generator and provides setpoints of the parameters via the transfer cable 236B to the HF RF generator. Upon receiving the setpoints of the parameters, the LF RF generator generates an RF signal 218A and sends the RF signal 218A via the output 230A, the RF cable 234A, and the input 232A to the first branch circuit. Similarly, upon receiving the setpoints of the parameters, the HF RF generator generates an RF signal 218B and sends the RF signal 218B via the output 230B, the RF cable 234B, and the input 232B to the second branch circuit.

The first branch circuit of the IMC 202 matches an impedance of a load coupled to the output 206 with an impedance of a source coupled to the input 232A to output a first modified RF signal at the connection of the IMC 202. An example of the load coupled to the output 206 includes the RF transmission line 210 and the plasma chamber 220. An example of the source coupled to the input 232A includes the RF cable 234A and the LF RF generator. Similarly, the second branch circuit of the IMC 202 matches an impedance of the load coupled to the output 206 with an impedance of a source coupled to the input 232B to output a second modified RF signal at the connection of the IMC 202. An example of the source coupled to the input 232B includes the RF cable 234B and the HF RF generator. The first and second modified RF signals are combined, such as added, at the connection of the IMC 202 and to output a modified RF signal 238 at the connection.

The modified RF signal 238 is provided from the connection point to the output 206, and is further provided from the output via the RF transmission line 210 to the lower electrode of the chuck 226. When one or more process gases, such as an oxygen containing gas or a fluorine containing gas, are supplied to the plasma chamber 220 in addition to supplying power of the modified RF signal 238 to the lower electrode of the chuck 226, plasma is stricken or maintained within the plasma chamber 220 to process a substrate S, which is placed on the upper surface of the chuck 226. Examples of the substrate S include a semiconductor wafer and a substrate stack.

While the modified RF signal 238 is being supplied to the lower electrode, the voltage sensor 204 measures the voltage 112 (FIGS. 1B-1 and 1D-1) at the output 206 to generate measurements of the voltage 112, and provides the measurements via the transfer cable 236C to the processor 214. In addition, the voltage sensor 204 provides times at which the measurements are made via the transfer cable 236C to the processor 214. Upon receiving the measurements of the voltage 112 and the times at which the measurements are made, the processor 214 identifies positive and negative crossings of each cycle of the voltage 112 and divides the voltage 112 into the bins 1m through Nm. For example, the processor 214 determines or identifies from the measurements a time at which the voltage 112 is at a pre-determined value, such as a value of the DC offset 114 (FIG. 1B-1) or a value of zero with no DC offset. The processor 214 further determines, from the measurements, that values of the voltage 112 increase at a time after the voltage 112 is at the pre-determined value compared to a time before the voltage 112 is at the pre-determined value. To illustrate, the processor 214 determines that values of the voltage 112 in a time interval between the times tMm and t1n (FIG. 1B-1) are greater than values of the voltage 112 in a time interval between the times t(M−1)m and tMm (FIG. 1B-1). As another illustration, the processor 214 determines that values of the voltage 112 in a time interval between the times tMm and t1r (FIG. 1D-1) are greater than values of the voltage 112 in a time interval between the times tQq and tMm (FIG. 1D-1). Upon determining that the value of the voltage 112 increases at a time after the voltage 112 is at the pre-determined value compared to a time before the voltage 112 is at the pre-determined value, the processor 214 determines that the time at which the pre-determined value occurs is a positive crossing.

As another example, the processor 214 determines or identifies from the measurements a time at which the voltage 112 is at the pre-determined value, such as a value of the DC offset 114 (FIG. 1B-1) or a value of zero with no DC offset. The processor 214 further determines, from the measurements, that values of the voltage 112 decrease at a time after the voltage 112 is at the pre-determined value compared to a time before the voltage 112 is at the pre-determined value. To illustrate, the processor 214 determines that values of the voltage 112 in a time interval between the times tNn and t1m (FIG. 1B-1) are less than values of the voltage 112 in a time interval between the times t(N−1)n and tNn (FIG. 1B-1).

As another illustration, the processor 214 determines that values of the voltage 112 in a time interval between the times tNn and t1q (FIG. 1D-1) are less than values of the voltage 112 in a time interval between the times tRr and tNn (FIG. 1D-1). Upon determining that values of the voltage 112 decrease at a time after the voltage 112 is at the pre-determined value compared to a time before the voltage 112 is at the pre-determined value, the processor 214 determines that the time at which the pre-determined value occurs is a negative crossing.

As another example, the processor 214 divides a time interval of the second half 112B (FIGS. 1B-1 and 1D-1) of each cycle of the voltage 112 into the bins 1n through Nn. To illustrate, the processor 214 divides a time interval from the time tMm to the time tNn into the bins 1n through Nn (see FIG. 1B-1) so that the bin 1n starts at the positive crossing 122 and the bin Nn ends at the negative crossing 124b. As another illustration, the processor 214 divides a time interval from the time tQq (FIG. 1D-1) to the time tRr into the bins 1n through Nn, where R is an integer. The time tQq is proximate to the time tMm of the positive crossing 122 of the cycle 1 and the time tRr is proximate to the time tNn of the negative crossing 124b (FIG. 1D-1) of the cycle 2. For example, the time tQq is within a pre-determined range from the time tMm of the positive crossing 122 of the cycle 1 and the time tRr is within the pre-determined range from the time tNn of the negative crossing 124b of the cycle 2. The pre-determined range associated with each crossing of the voltage 112 is stored in the memory device 216. In this example, the processor 214 does not divide a time interval of the first half 112A (FIGS. 1B-1 and 1D-1) of each cycle of the voltage 112 into the bins 1m through Mm.

As yet another example, the processor 214 divides the time interval of the first half 112A of each cycle of the voltage 112 into the bins 1m through Mm. In this example, the processor 214 does not divide the time interval of the second half 112B of each cycle of the voltage 112 into the bins 1n through Nn. To illustrate, the processor 214 divides a time interval from the time tNn to the time tMm into the bins 1m through Mm (FIG. 1B-1) so that the bin 1m starts at the negative crossing 124a and the bin Mm ends at the positive crossing 122. As another illustration, the processor 214 divides a time interval from the time tRr (FIG. 1D-1) to the time tQq into the bins 1m through Mm. The time tRr is proximate to the time tNn of the negative crossing 124a of the cycle 1 and the time tQq is proximate to the time tMm of the positive crossing 122 (FIG. 1D-1) of the cycle 1. For example, the time tRr is within a pre-determined range from the time tNn of the negative crossing 124a of the cycle 1 and the time tQq is within the pre-determined range from the time tMm of the positive crossing 122 of the cycle 1. In this example, the processor 214 does not divide a time interval of the second half 112B (FIGS. 1B-1 and 1D-1) of each cycle of the voltage 112 into the bins 1n through Nn.

As still another example, the processor 214 divides a time interval of each cycle of the voltage 112 into the bins 1m through Nn. To illustrate, the processor 214 identifies, from the measurements, the negative crossing 124a (FIG. 1D-1) of the cycle 1 of the voltage 112 and identifies, from the measurements, the consecutive negative crossing 124b (FIG. 1D-1) of the cycle 1 or the cycle 2 of the voltage 112. The processor 214 determines a time period taken, by the voltage sensor 204, to obtain the measurements between the two consecutive negative crossings 124a and 124b. The processor 214 divides the time period into a pre-determined number of time intervals to generate the bins 1m through Nn. The time period to obtain the measurements of the voltage 112 for each cycle of the voltage 112 is sent from the voltage sensor 204 via the transfer cable 236C with the measurements to the processor 214. The pre-determined number of time intervals is stored in the memory device 216 and received as an input from a user via a user interface including an input device, such as a mouse, a keyboard, or a keypad, a display device, a display screen, or a combination thereof. The input device is coupled to the processor 214. As another example, the processor 214 divides a portion of a time interval of each cycle of the voltage 112 into a pre-stored number of bins. Examples of the pre-stored number of bins are provided below.

Moreover, the processor 214 receives, via the transfer cable 236D, the measurements of delivered power from the power sensor 224 and times at which the measurements are generated by the power sensor 224. Times during which the measurements of delivered power are obtained by the power sensor 224 for each cycle of the voltage 112 are sent from the power sensor 224 via the transfer cable 236D with the measurements to the processor 214. The delivered power at the output 230B is measured by the power sensor 224 to generate the measurements of delivered power. The processor 214 correlates the measurements of delivered power to the bins 1m through Nn. For example, the processor 214 determines that a first set of measurements or a first measurement of delivered power corresponds to a time period of the bin 1n and a second set of measurements or a second measurement of delivered power corresponds to a time period of the bin 2n. A measurement of delivered power includes one value of delivered power and a set of measurements of delivered power includes multiple values of delivered power. Upon receiving multiple values of delivered power during a bin, the processor 214 calculates an average or a median of the values to determine a single measurement of the delivered power for the bin.

For each of the pre-stored number of bins from the bins 1m through Nn, the processor 214 determines a frequency level, which is an amount of frequency of operation, of the HF RF generator to achieve a pre-determined level UNFM, such as a value or a range of consecutive values, of uniformity. For example, the processor 214 determines that an increase in a frequency level of the HF RF generator from a set point value to a level HF1m during the bin 1m will increase the delivered power from a measured level, such as a measurement, for the bin 1m to a level PR1m for the bin 1m to further achieve the level UNFM. The measured level of delivered power for the bin 1m is received from the power sensor 224 in the manner described above. The processor 214 controls the HF RF generator during the bin 1m of the cycle 1 of the voltage 112 to achieve the frequency level HF1m and receives a measurement of the power level PR1m from the power sensor 224 to determine that the increase in the frequency level from the set point value to the level HF1m will increase the delivered power from the measured level to the level PR1m. The delivered power increases to the level PR1m to achieve or surpass the level UNFM of uniformity. A correspondence between the level PR1m and the level UNFM is stored in a table 240 in the memory device 216. The processor 214 stores the determined frequency level HF1m as corresponding to the bin 1m in the table 240.

As another example, the processor 214 determines that an increase in a frequency level of the HF RF generator from the set point value to the level HF1m during the bin 1m will decrease, instead of increasing, the delivered power from the measured level for the bin 1m to the level PR1m for the bin 1m.

As yet another example, the processor 214 determines that instead of an increase, a decrease in a frequency level of the HF RF generator from the set point value to the level HF1m during the bin 1m will increase the delivered power from the measured level for the bin 1m to the level PR1m for the bin 1m.

As still another example, the processor 214 determines that a decrease in a frequency level of the HF RF generator from the set point value to the level HF1m during the bin 1m will decrease, instead of increasing, the delivered power from the measured level for the bin 1m to the level PR1m for the bin 1m.

Similarly, as another example, the processor 214 determines that an increase in a frequency level of the HF RF generator to a level HF2m from the level HF1m of the bin 1m or from the set point value will increase the delivered power from a measured level for the bin 2m to a level PR2m for the bin 2m to further achieve the level UNFM. The measured level of delivered power for the bin 2m is received from the power sensor 224 in the manner described above. The processor 214 controls the HF RF generator during the bin 2m of the cycle 1 of the voltage 112 to achieve the frequency level HF2m and receives a measurement of the power level PR2m from the power sensor 224 to determine that the increase in the frequency level to the level HF2m will increase the delivered power from the measured level to the level PR2m. The delivered power increases to the level PR2m to achieve the level UNFM of uniformity. A correspondence between the level PR2m and the level UNFM is stored in the table 240 in the memory device 216. The processor 214 stores the determined frequency level HF2m as corresponding to the bin 2m in the table 240.

As another example, the processor 214 determines that an increase in a frequency level of the HF RF generator from the level HF1m to the level HF2m during the bin 2m will decrease, instead of increasing, the delivered power from the measured level for the bin 2m to the level PR2m for the bin 2m.

As yet another example, the processor 214 determines that instead of an increase, a decrease in a frequency level of the HF RF generator to the level HF2m during the bin 2m will increase the delivered power from the measured level for the bin 2m to the level PR2m for the bin 2m.

As still another example, the processor 214 determines that a decrease in a frequency level of the HF RF generator to the level HF2m during the bin 2m will decrease, instead of increasing, the delivered power from the measured level for the bin 2m to the level PR2m for the bin 2m.

As another example, the processor 214 determines that an increase in a frequency level of the HF RF generator to a level HFMm during the bin Mm will increase the delivered power from a measured level for the bin Mm to a level PRMm for the bin Mm to further achieve the level UNFM. The frequency level is increased from a frequency level HF(M−1)m for a bin (M−1)m to the level HFMm. The measured level of delivered power for the bin Mm is received from the power sensor 224 in the manner described above. The processor 214 controls the HF RF generator during the bin Mm of the cycle 1 of the voltage 112 to achieve the frequency level HFMm and receives a measurement of the power level PRMm from the power sensor 224 to determine that the increase in the frequency level to the level HFMm will increase the delivered power from the measured level to the level PRMm. The delivered power increases to the level PRMm to achieve the level UNFM of uniformity. A correspondence between the level PRMm and the level UNFM is stored in the table 240. The processor 214 stores the determined frequency level HFMm as corresponding to the bin Mm in the table 240.

As another example, the processor 214 determines that an increase in a frequency level of the HF RF generator from the frequency level HF(M−1)m to the level HFMm during the bin Mm will decrease, instead of increasing, the delivered power from the measured level for the bin Mm to the level PRMm for the bin Mm.

As yet another example, the processor 214 determines that instead of an increase, a decrease in a frequency level of the HF RF generator to the level HFMm during the bin Mm will increase the delivered power from the measured level for the bin Mm to the level PRMm for the bin Mm.

As yet another example, the processor 214 determines that a decrease in a frequency level of the HF RF generator to the level HFMm during the bin Mm will decrease, instead of increasing, the delivered power from the measured level for the bin Mm to the level PRMm for the bin Mm.

As yet another example, the processor 214 determines that an increase in a frequency level of the HF RF generator from the level HFMm to a level HF1n during the bin 1n will increase the delivered power from a measured level for the bin 1n to a level PR1n for the bin 1n to further achieve the level UNFM. The measured level of delivered power for the bin 1n is received from the power sensor 224 in the manner described above. The processor 214 controls the HF RF generator during the bin 1n of the cycle 1 of the voltage 112 to achieve the frequency level HF1n and receives a measurement of the power level PR1n from the power sensor 224 to determine that the increase in the frequency level to the level HF1n will increase the delivered power from the measured level to the level PR1n. The delivered power increases to the level PR1n to achieve the level UNFM of uniformity. A correspondence between the level PR1n and the level UNFM is stored in a table 242 in the memory device 216. The processor 214 stores the determined frequency level HF1n as corresponding to the bin 1n in the table 242.

As another example, the processor 214 determines that an increase in a frequency level of the HF RF generator from the frequency level HFMm to the level HF1n during the bin 1n will decrease, instead of increasing, the delivered power from the measured level for the bin 1n to the level PR1n for the bin 1n.

As yet another example, the processor 214 determines that instead of an increase, a decrease in a frequency level of the HF RF generator to the level HF1n during the bin 1n will increase the delivered power from the measured level for the bin 1n to the level PR1n for the bin 1n.

As yet another example, the processor 214 determines that a decrease in a frequency level of the HF RF generator to the level HF1n during the bin 1n will decrease, instead of increasing, the delivered power from the measured level for the bin 1n to the level PR1n for the bin 1n.

Similarly, as another example, the processor 214 determines that an increase in a frequency level of the HF RF generator from the level HF1n to a level HF2n during the bin 2n will increase the delivered power from a measured level for the bin 2n to a level PR2n for the bin 2n to further achieve the level UNFM. The measured level of delivered power for the bin 2n is received from the power sensor 224 in the manner described above. The processor 214 controls the HF RF generator during the bin 2n of the cycle 1 of the voltage 112 to achieve the frequency level HF2n and receives a measurement of the power level PR2n from the power sensor 224 to determine that the increase in the frequency level to the level HF2n will increase the delivered power from the measured level to the level PR2n. The delivered power increases to the level PR2n to achieve the level UNFM of uniformity. A correspondence between the level PR2n and the level UNFM is stored in the table 242 in the memory device 216. The processor 214 stores the determined frequency level HF2n as corresponding to the bin 2n in the table 240.

As another example, the processor 214 determines that an increase in a frequency level of the HF RF generator from the frequency level HF1n to the level HF2n during the bin 2n will decrease, instead of increasing, the delivered power from the measured level for the bin 2n to the level PR2n for the bin 2n.

As yet another example, the processor 214 determines that instead of an increase, a decrease in a frequency level of the HF RF generator to the level HF2n during the bin 2n will increase the delivered power from the measured level for the bin 2n to the level PR2n for the bin 2n.

As yet another example, the processor 214 determines that a decrease in a frequency level of the HF RF generator to the level HF2n during the bin 2n will decrease, instead of increasing, the delivered power from the measured level for the bin 2n to the level PR2n for the bin 2n.

As another example, the processor 214 determines that an increase in a frequency level of the HF RF generator to a level HFNn during the bin Nn will increase the delivered power from a measured level for the bin Nn to a level PRNn for the bin Nn. The frequency level is increased from a frequency level HF(N−1)n for a bin (N−1)n to the level HFNn for the bin Nn to further achieve the level UNFM. The measured level of delivered power for the bin Nn is received from the power sensor 224 in the manner described above. The processor 214 controls the HF RF generator during the bin Nn of the cycle 1 of the voltage 112 to achieve the frequency level HFNn and receives a measurement of the power level PRNn from the power sensor 224 to determine that the increase in the frequency level to the level HFNn will increase the delivered power from the measured level to the level PRNn. The delivered power increases to the level PRNn to achieve the level UNFM of uniformity. A correspondence between the level PRNn and the level UNFM is stored in the table 240. The processor 214 stores the determined frequency level HFNn as corresponding to the bin Nn in the table 240.

As another example, the processor 214 determines that an increase in a frequency level of the HF RF generator from the frequency level HF(N−1)n to the level HFNn during the bin Nn will decrease, instead of increasing, the delivered power from the measured level for the bin Nn to the level PRNn for the bin Nn.

As still another example, the processor 214 determines that instead of an increase, a decrease in a frequency level of the HF RF generator to the level HFNn during the bin Nn will increase the delivered power from the measured level for the bin Nn to the level PRNn for the bin Nn.

As yet another example, the processor 214 determines that a decrease in a frequency level of the HF RF generator to the level HFNn during the bin Nn will decrease, instead of increasing, the delivered power from the measured level for the bin Nn to the level PRNn for the bin Nn.

In one embodiment, the level of uniformity is achieved when a pre-determined value of uniformity is reached or when a value within a pre-set range from the pre-determined value of uniformity is reached. An example of the pre-set range is a range of ±5% from the pre-determined value. The pre-set range and the pre-determined value of uniformity are stored in the memory device 216.

Examples of the uniformity include etch rate uniformity across a surface of the substrate or deposition rate uniformity across the surface of the substrate. As an example, a uniformity level is a statistical value, such as an average or a median of etch rates across the surface of the substrate. As another example, a uniformity level is a maximum or a minimum of all etch rates across the surface of the substrate.

An example of the pre-stored number of bins from the bins 1m through Nn includes a number of the bins 1m through Mm for the first half 112A of the cycle 1 of the voltage 112.

Another example of the pre-stored number of bins from the bins 1m through Nn includes a number of the bins 1n through Nn for the second half 112B of the cycle 1 of the voltage 112.

Yet another example of the pre-stored number of bins includes one or more, such as all, of the bins 1m through Nn of a cycle of the voltage 112.

Still another example of the pre-stored number of bins from the bins 1m through Nn includes a number of the bins 1n through Nn for a first quarter of the cycle 1 of the voltage 112 or a second quarter of the cycle 1 or a third quarter of the cycle 1 or a fourth quarter of the cycle 1. The second quarter of the cycle 1 is consecutive to the first quarter of the cycle 1. Similarly, the third quarter of the cycle 1 is consecutive to the second quarter of the cycle 1 and the fourth quarter of the cycle 1 is consecutive to the third quarter of the cycle 1.

Another example of the pre-stored number of bins includes a pre-determined number of bins associated with the positive crossing 122. To illustrate, the pre-determined number of bins associated with the positive crossing 122 includes the bin 1n (FIGS. 1B-1 and 1D-1) or the bin Mm (FIG. 1B-1) that includes the time tMm of the positive crossing 122.

As another illustration, the pre-determined number of bins associated with the positive crossing 122 includes the bin 1n or the bin Mm (FIG. 1B-1) and a pre-set number of additional bins that are adjacent to the bin 1n or the bin Mm. The pre-set number of additional bins is stored in the memory device 216. As an example, the bins 2n and Mm are adjacent to the bin 1n (FIG. 1B-1) and the bins (M−1)m and 1n are adjacent to the bin Mm (FIG. 1B-1).

Also, as another example, the bin 2n, a bin 3n (FIG. 1B-1), and the bins (M−1)m and Mm are adjacent to the bin 1n (FIG. 1B-1), and a bin (M−2)m (FIG. 1B-1), the bin (M−1)m, and the bins 1n and 2n (FIG. 1B-1) are adjacent to the bin Mm. One or more bins are adjacent to an additional bin when there is no other bin between the one or more bins and the additional bin.

As yet another example, bins that are within the second quarter of the cycle 1 of the voltage 112 and within the third quarter of the cycle 1 are examples of the pre-determined number of bins associated with the positive crossing 122.

As still another illustration, the pre-determined number of bins associated with the positive crossing 122 includes the bin 1n (FIG. 1D-1) and a pre-set number of additional bins that are adjacent to the bin 1n. The bins 2n and Mm are adjacent to the bin 1n (FIG. 1D-1). Also, the bins 2n and 3n (FIG. 1D-1), and the bins (M−1)m and Mm are adjacent to the bin 1n (FIG. 1D-1).

It should be noted that in one embodiment, the pre-determined number of bins associated with the positive crossing 122 of a cycle is less than a number of bins for half of the cycle. For example, the pre-determined number of bins associated with the positive crossing 122 of the cycle 1 is less than a number of bins of the first half 112A or the second half 112B of the cycle 1.

Another example of the pre-stored number of bins includes a pre-determined number of bins associated with the negative crossing 124a. To illustrate, the pre-determined number of bins associated with the negative crossing 124a includes the bin Nn or the bin 1m (FIGS. 1B-1 and 1D-1) that includes the time tNn of the negative crossing 124a.

As another illustration, the pre-determined number of bins associated with the negative crossing 124a includes the bin Nn or the bin 1m (FIG. 1B-1) and a pre-set number of additional bins that are adjacent to the bin Nn or the bin 1m. As an example, the bins (N−1)n and 1m are adjacent to the bin Nn (FIG. 1B-1) and the bins 2m and Nn are adjacent to the bin 1m (FIG. 1B-1).

Also, as another example, the bin (N−1)n, a bin (N−2)n (FIG. 1B-1), and the bins 1m and 2m are adjacent to the bin Nn (FIG. 1B-1), and the bins (N−1)n and Nn, and the bins 2m and 3m (FIG. 1B-1) are adjacent to the bin 1m.

As yet another example, bins that are within the fourth quarter of the cycle 0 of the voltage 112 and within the first quarter of the cycle 1 are examples of the pre-determined number of bins associated with the negative crossing 124a.

As still another illustration, the pre-determined number of bins associated with the negative crossing 124a includes the bin 1m (FIG. 1D-1) and a pre-set number of additional bins that are adjacent to the bin 1m. The bins 2m and Nn are adjacent to the bin 1m (FIG. 1D-1). Also, the bins 2m and 3m (FIG. 1D-1), and the bins (N−1)n and Nn are adjacent to the bin 1m (FIG. 1D-1).

It should be noted that in one embodiment, the pre-determined number of bins associated with the negative crossing, such as the negative crossing 124a or 124b, of a cycle is less than a number of bins for half of the cycle. For example, the pre-determined number of bins associated with the negative crossing 124a of the cycle 1 is less than a number of bins of a second half of the cycle 0 or the first half 112A of the cycle 1.

In an embodiment, after obtaining the measurements of the delivered power for the pre-stored number of bins of the cycle 1 of the voltage 112, the processor 214 determines whether a pre-determined statistical power value of delivered power for the pre-stored number of bins of the cycle 1 is achieved. Examples of a statistical power value of delivered power for the pre-stored number of bins includes a mean or a median of multiple values of the delivered power for the pre-stored number of bins. Upon determining that the pre-determined statistical power value is not achieved, the processor 214 modifies one or more of the frequency levels for one or more of the pre-stored number of bins. The processor 214 continues to modify the one or more of the frequency levels until the pre-determined statistical power value of delivered power for the pre-stored number of bins of the cycle 1 is achieved.

For example, after obtaining the measurements of the delivered power for the bins 1m through Mm of the cycle 1 of the voltage 112 from the power sensor 224, the processor 214 determines whether the pre-determined statistical power value of delivered power for the bins 1m through Mm of the cycle 1 is achieved by frequency levels for the bins 1m through Mm. For example, the processor 214 obtains the measurements of delivered power for the bins 1m through Mm, and calculates a mean of the measurements to determine an average delivered power level for the bins 1m through Mm of the cycle 1. The processor 214 further determines whether the average delivered power level for the bins 1m through Mm of the cycle 1 is greater than a pre-determined average delivered power level stored within the memory device 216 for the bins 1m through Mm. The pre-determined average delivered power level for the first half 112A is received by the processor 214 from the user via the user interface including the input device. Upon determining that the average delivered power level for the bins 1m through Mm is greater than the pre-determined average delivered power level for the bins 1m through Mm, the processor 214 does not modify one or more of the frequency levels for the bins 1m through Mm. On the other hand, upon determining that the average delivered power level for the bins 1m through Mm is not greater than the pre-determined average delivered power level for the bins 1m through Mm, the processor 214 changes one or more of the frequency levels for the bins 1m through Mm. The processor 214 continues to change one or more of the frequency levels for the bins 1m through Mm until the average delivered power level for the bins 1m through Mm is greater than the pre-determined average delivered power level for the bins 1m through Mm. The frequency levels for the bins 1m through Mm are modified to the frequency levels HF1m through HFMm.

In an embodiment, instead of changing one or more of the frequency levels for the bins 1m through Mm during the bins 1m through Mm of the cycle 1 of the voltage 112, the processor 214 changes one or more of the frequency levels for the bins 1m through Mm during the bins 1m through Mm of multiple consecutive cycles of the voltage 112 until the average delivered power level for the bins 1m through Mm is greater than the pre-determined average delivered power level for the bins 1m through Mm.

As another example, after obtaining the measurements of the delivered power for the bins 1n through Nn of the cycle 1 of the voltage 112 from the power sensor 224, the processor 214 determines whether the pre-determined statistical power value of delivered power for the bins 1n through Nn of the cycle 1 is achieved by frequency levels for the bins 1n through Nn. For example, the processor 214 obtains the measurements of delivered power for the bins 1n through Nn, and calculates a mean of the measurements to determine an average delivered power level for the bins 1n through Nn of the cycle 1. The processor 214 further determines whether the average delivered power level for the bins 1n through Nn of the cycle 1 is greater than a pre-determined average delivered power level stored within the memory device 216 for the bins 1n through Nn. The pre-determined average delivered power level for the second half 112B is received by the processor 214 from the user via the user interface including the input device. Upon determining that the average delivered power level for the bins 1n through Nn is greater than the pre-determined average delivered power level for the bins 1n through Nn, the processor 214 does not modify one or more of the frequency levels for the bins 1n through Nn. On the other hand, upon determining that the average delivered power level for the bins 1n through Nn is not greater than the pre-determined average delivered power level for the bins 1n through Nn, the processor 214 changes one or more of the frequency levels for the bins 1m through Mm. The processor 214 continues to change one or more of the frequency levels for the bins 1n through Nn until the average delivered power level for the bins 1n through Nn is greater than the pre-determined average delivered power level for the bins 1n through Nn. The frequency levels for the bins 1n through Nn are modified to the frequency levels HF1n through HFNn.

In an embodiment, instead of changing one or more of the frequency levels for the bins 1n through Nn during the bins 1n through Nn of the cycle 1 of the voltage 112, the processor 214 changes one or more of the frequency levels for the bins 1n through Nn during the bins 1n through Nn of multiple consecutive cycles of the voltage 112 until the average delivered power level for the bins 1n through Nn is greater than the pre-determined average delivered power level for the bins 1n through Nn.

In an embodiment, after obtaining the measurements of the delivered power for the pre-stored number of bins of the cycle 1 of the voltage 112, the processor 214 determines whether a pre-determined statistical power value of delivered power for the entire cycle 1 of the voltage 112 is achieved. Examples of a statistical power value of delivered power for the cycle of the voltage include a mean or a median of multiple values of the delivered power for all the bins of the cycle. Upon determining that the pre-determined statistical power value is not achieved, the processor 214 modifies one or more of the frequency levels for one or more of the pre-stored number of bins. The processor 214 continues to modify the one or more of the frequency levels until the pre-determined statistical power value of delivered power for the cycle 1 is achieved. The frequency levels for the bins 1m through Nn are modified to the frequency levels HF1m through HFNn.

As used herein, a pre-determined statistical power value of delivered power for the pre-stored number of bins corresponds to the uniformity level UNFM. For example, when the pre-determined statistical power value is achieved for the pre-stored number of bins, the uniformity level UNFM is achieved.

In one embodiment, instead of the pre-determined statistical power value of delivered power, a pre-determined ratio of delivered power is used. An example of the ratio of delivered power includes a ratio of an average delivered power for the bins 1n through Nn and an average delivered power for the bins 1m through Mm.

Another example of the ratio of delivered power includes a ratio of the average delivered power for the bins 1m through Mm and the average delivered power for the bins 1n through Nn. For example, the processor 214 determines whether the pre-determined ratio of delivered power is achieved from frequency levels of the bins 1m through Nn during the cycle 1. Upon determining that the pre-determined ratio of delivered power is not achieved, the processor 214 modifies one or more of the frequency levels of the bins 1m through Nn. The processor 214 continues to modify the one or more of the frequency levels of the bins 1m through Nn until the pre-determined ratio of delivered power is achieved. The pre-determined ratio of delivered power corresponds to the uniformity level UNFM. For example, when the pre-determined ratio of delivered power is achieved for the cycle 1, the uniformity level UNFM is achieved.

The processor 214 generates the table 240, which includes a correspondence between each of the bins 1m through Mm, a corresponding one of the frequency values HF1m through HFMm, a corresponding one of the power levels PR1m through PRMm, the pre-determined statistical power value of delivered power for the pre-stored number of bins, and the uniformity level UNFM, and stores the table 240 in the memory device 216. Similarly, the processor 214 generates the table 242, which includes a correspondence between each of the bins 1n through Nn, a corresponding one of the frequency values HF1n through HFNn, a corresponding one of the power levels PR1n through PRNn, the pre-determined statistical power value of delivered power for the pre-stored number of bins, and the uniformity level UNFM, and stores the table 242 in the memory device 216.

The processor 214 applies the high frequency levels within the tables 240 and 242 during one or more consecutively following cycles of the voltage 112. For example, when the high frequency levels are determined during the cycle 1 of the voltage 112, the processor 214 applies the high frequency levels within the tables 240 and 242 during the cycle 2 of the voltage 112.

As another example, when the high frequency levels are determined during the cycle 1 of the voltage 112, the processor 214 applies the high frequency levels within the tables 240 and 242 during the cycles 2 and 3 of the voltage 112.

As yet another example, when the high frequency levels are determined during the cycles 1 and 2 of the voltage 112, the processor 214 applies the high frequency levels of the tables 240 and 242 during the cycle 3 of the voltage 112.

As another example, the processor 214 applies the high frequency level HF1n that is determined during the bin 1n of the cycle 1 of the voltage 112. The high frequency level HF1n is applied during the bin 1n, such as from a time of start of the bin 1n until a time of end of the bin 1n, of the cycle 2 of the voltage 112. An example of the time of start of the bin 1n includes the time tMm (FIG. 1D-1) or the time tQq (FIG. 1D-1). An example of the time of end of the bin 1n includes the time t1n (FIG. 1D-1) or the time t1r (FIG. 1D-1).

As yet another example, the processor 214 applies the high frequency level HFNn that is determined during the bin Nn of the cycle 1 of the voltage 112. The high frequency level HFNn is applied during the bin Nn, such as from a time of start of the bin Nn until a time of end of the bin Nn, of the cycle 2 of the voltage 112. An example of the time of start of the bin Nn includes a time t(N−1)n (FIG. 1B-1) or the time t(R−1)r (FIG. 1D-1). An example of the time of end of the bin Nn includes a time tNn (FIG. 1B-1) or the time tRr (FIG. 1D-1).

As another example, the processor 214 applies the high frequency level HF1m determined during the bin 1m of the cycle 1 of the voltage 112, and the high frequency level HF1m is applied during the bin 1m of the cycle 2 of the voltage 112.

As yet another example, the processor 214 applies the high frequency level HF1m determined during the bin Mm of the cycle 1 of the voltage 112, and the high frequency level HF1m is applied during the bin Mm of the cycle 2 of the voltage 112.

As another example, during a time period for the bin 1n of the cycle 2 of the voltage 112, the processor 214 sends a data signal having the frequency value HF1n via the transfer cable 236B to the HF RF generator. Upon receiving the data signal having the frequency value HF1n during the time period for the bin 1n of the cycle 2, the HF RF generator generates the RF signal 218B having the high frequency level HF1n.

Similarly, during a time period for the bin Nn of the cycle 2 of the voltage 112, the processor 214 sends a data signal having the frequency level HFNn via the transfer cable 236B to the HF RF generator. Upon receiving the data signal having the frequency value HFNn during the time period for the bin Nn of the cycle 2, the HF RF generator generates the RF signal 218B having the high frequency level HFNn.

As yet another example, during a time period for the bin 1m of the cycle 2 of the voltage 112, the processor 214 sends a data signal having the frequency value HF1m via the transfer cable 236B to the HF RF generator. Upon receiving the data signal having the frequency value HF1m during the time period for the bin 1m of the cycle 2, the HF RF generator generates the RF signal 218B having the frequency level HF1m.

Similarly, during a time period for the bin Mm of the cycle 2 of the voltage 112, the processor 214 sends a data signal having the frequency level HFMm via the transfer cable 236B to the HF RF generator. Upon receiving the data signal having the frequency value HFMm during the time period for the bin Mm of the cycle 2, the HF RF generator generates the RF signal 218B having the frequency level HFMm.

It should be noted that the processor 214 determines a change from one cycle to another of the voltage 112 based on a clock signal generated by a clock generator and based on values of the voltage 112 received from the voltage sensor 204. For example, the processor 214 determines that values of the voltage 112 repeat during a second time period that is consecutive to a first time period. Upon determining that values of the voltage 112 start repeating, the processor 114 determines that the change in the cycle, such as from the cycle 1 to the cycle 2, has occurred. As another example, the processor 214 determines that a type of crossing, such as a consecutive positive crossing or a consecutive negative crossing, has occurred consecutively after an occurrence of the type of crossing during a preceding cycle of the voltage 112 to determine that a change from the preceding cycle to a consecutive cycle has occurred.

The first and second time periods are portions of the clock signal generated by the clock generator, which is coupled to the processor 214. The clock generator provides the clock signal including the first and second time periods to the processor 214. In an embodiment, the clock generator is a part of the processor 214. In one embodiment, the processor 214 obtains the clock signal from a computer network, such as the Internet.

In one embodiment, the processor 214 applies some but not all of the high frequency levels within the tables 240 and 242 during one or more consecutively following cycles of the voltage 112. For example, the processor 214 applies the high frequency levels HF1n through HFNn determined during the second half 112B of the cycle 1 of the voltage 112 to the bins 1n through Nn of the cycle 2 of the voltage 112 but does not apply the high frequency levels HF1m through HFMm determined during the first half 112A of the cycle 1 of the voltage 112 to the bins 1m through Mm of the cycle 2.

As another example, the processor 214 applies the high frequency levels HF1m through HFMn determined during the first half 112A of the cycle 1 of the voltage 112 to the bins 1m through Mm of the cycle 2 of the voltage 112 but does not apply the high frequency levels HF1n through HFNn determined during the second half 112B of the cycle 1 of the voltage 112 to the bins 1n through Mn of the cycle 1.

As yet another example, the processor 214 applies the high frequency levels for the pre-stored number of bins during the pre-stored number of bins of the cycle 2 of the voltage 112.

As yet another example, the processor 214 applies the high frequency levels HF1n through HF(N/2)n determined during the third quarter of the cycle 1 of the voltage 112 to the bins 1n through (N/2)n of the cycle 2 of the voltage 112 but does not apply the high frequency levels HF1m through HFMm determined during the first half 112A of the cycle 1 of the voltage 112 to the bins 1m through Mm of the cycle 2 and does not apply the high frequency levels HF((N/2)+1)n through HFNn determined during the fourth quarter of the cycle 1 of the voltage 112 to the bins 1n through ((N/2)+1)n of the cycle 2 of the voltage 112.

In an embodiment, a frequency level, such as a high frequency level, includes one or more frequency values. For example, the frequency level includes a single frequency value. As another example, the frequency level includes multiple frequency values, and the frequency values of one frequency level are exclusive of or different from or not the same as or do not match frequency values of another frequency level.

In one embodiment, instead of the power sensor 224, a voltage sensor (not shown?) is used. When the voltage sensor is used instead of the power sensor 224, the processor 214 receives measurements of voltage from the voltage sensor and calculates power based on the measurements.

Figure 3A:
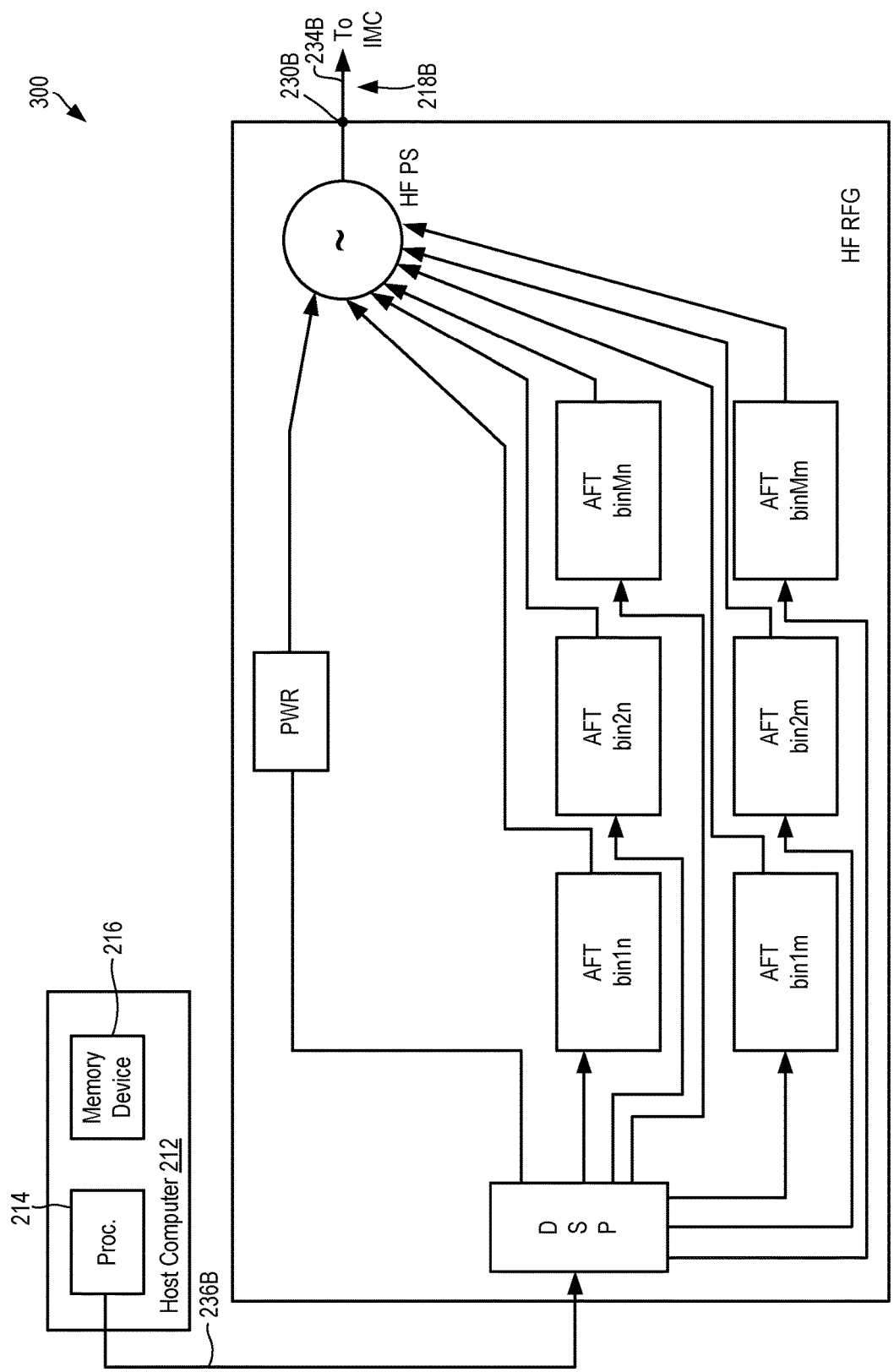
FIG. 3A is a diagram of an embodiment of a system to illustrate an operation of the HF RF generator.

FIG. 3A is a diagram of an embodiment of a system 300 to illustrate an operation of the HF RF generator. The system 300 includes the host computer 212 and the HF RF generator. The HF RF generator includes a digital signal processor (DSP) and a power controller PWR. As an example, a controller includes a processor and a memory device, such as a register. The processor is coupled to the register.

The HF RF generator further includes auto-frequency tuners (AFTs) for the bins 1n through Nn. Examples of an AFT, as used herein, includes a controller, which includes a processor and a memory device. An example of the memory device of the AFT is a register. The HF RF generator includes an auto-frequency tuner AFTbin1m for the bin 1m, an auto-frequency tuner AFTbin2m for the bin 2m, and so on until an auto-frequency tuner AFTbinMm for the bin Mm. The HF RF generator includes an auto-frequency tuner AFTbin1n for the bin 1n, an auto-frequency tuner AFTbin2n for the bin 2n, and so on until an auto-frequency tuner AFTbinNn for the bin Nn.

The HF RF generator includes an HF power supply (PS), which is an RF oscillator. The RF oscillator is an electronic oscillator that produces a periodic, oscillating electronic signal, such as a sine wave.

The DSP of the HF RF generator is coupled to the power controller PWR and is coupled to the auto-frequency tuners AFTbin1m through AFTbinNn of the HF RF generator. The power controller PWR and the auto-frequency tuners AFTbin1m through AFTbinNn are coupled to the HF power supply of the HF RF generator. The HF power supply is coupled to the RF cable 234B. The DSP is coupled to the processor 214 via the transfer cable 236B.

Figure 3B:
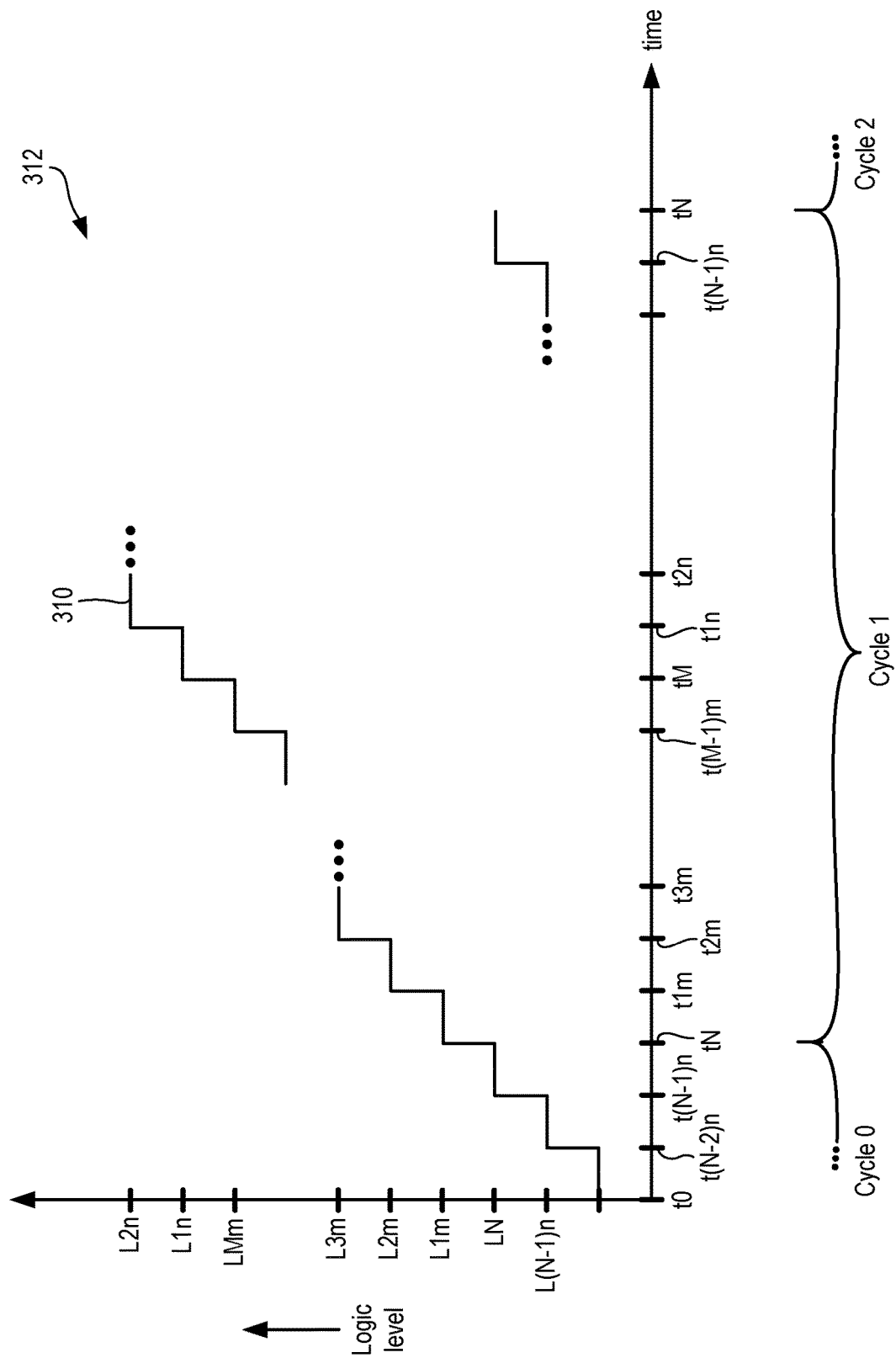
FIG. 3B is an embodiment of a graph that plots a logic level of a digital pulsed signal versus time.

The processor 214 accesses the high frequency levels HF1m through HFNn from the tables 240 and 242 (FIG. 2) and sends the high frequency levels HF1m through HFNn via the transfer cable 236B to the DSP. The processor 214 also generates a digital pulsed signal that is pulsed according to the bins 1m through Mm during each cycle of the voltage 112, and sends the digital pulsed signal via the transfer cable 236B to the DSP. An example of the digital pulsed signal is a digital pulsed signal 310 that is illustrated in FIG. 3B. FIG. 3B is an embodiment of a graph 312 that plots a logic level of the digital pulsed signal 310 versus the time t.

The digital pulsed signal 310 has a logic level for each of the bins 1m through Nn illustrated in FIG. 1B-1. For example, the digital pulsed signal 310 has a logic level L(N−1)n for the bin (N−1)n of FIG. 1B-1, has another logic level LN for the bin Nn of FIG. 1B-1, has another logic level L1m for the bin 1m of FIG. 1B-1, has another logic level L2m for the bin 2m of FIG. 1B-1 and so until a logic level LM for the bin Mm of FIG. 1B-1. The logic level L(N−1)n occurs during a time period between a time t(N−2)n and the time t(N−1)n.

Similarly, the logic level LNn occurs during a time period between the times t(N−1)n and the time tNn, the logic level L1m occurs during a time period between the times tNn and t1m, the logic level L2m occurs during a time period between the times t1m and t2m, the logic level L3m occurs during a time period between the times t2m and t3m, the logic level LMm occurs during a time period between a times t(M−1)m and the time tMm. The logic levels L1m through LNn repeat during each cycle of the voltage 112. Each logic level during a cycle of the voltage 112 is a horizontal level and has a value different from another logic level during the cycle.

Figure 3C:
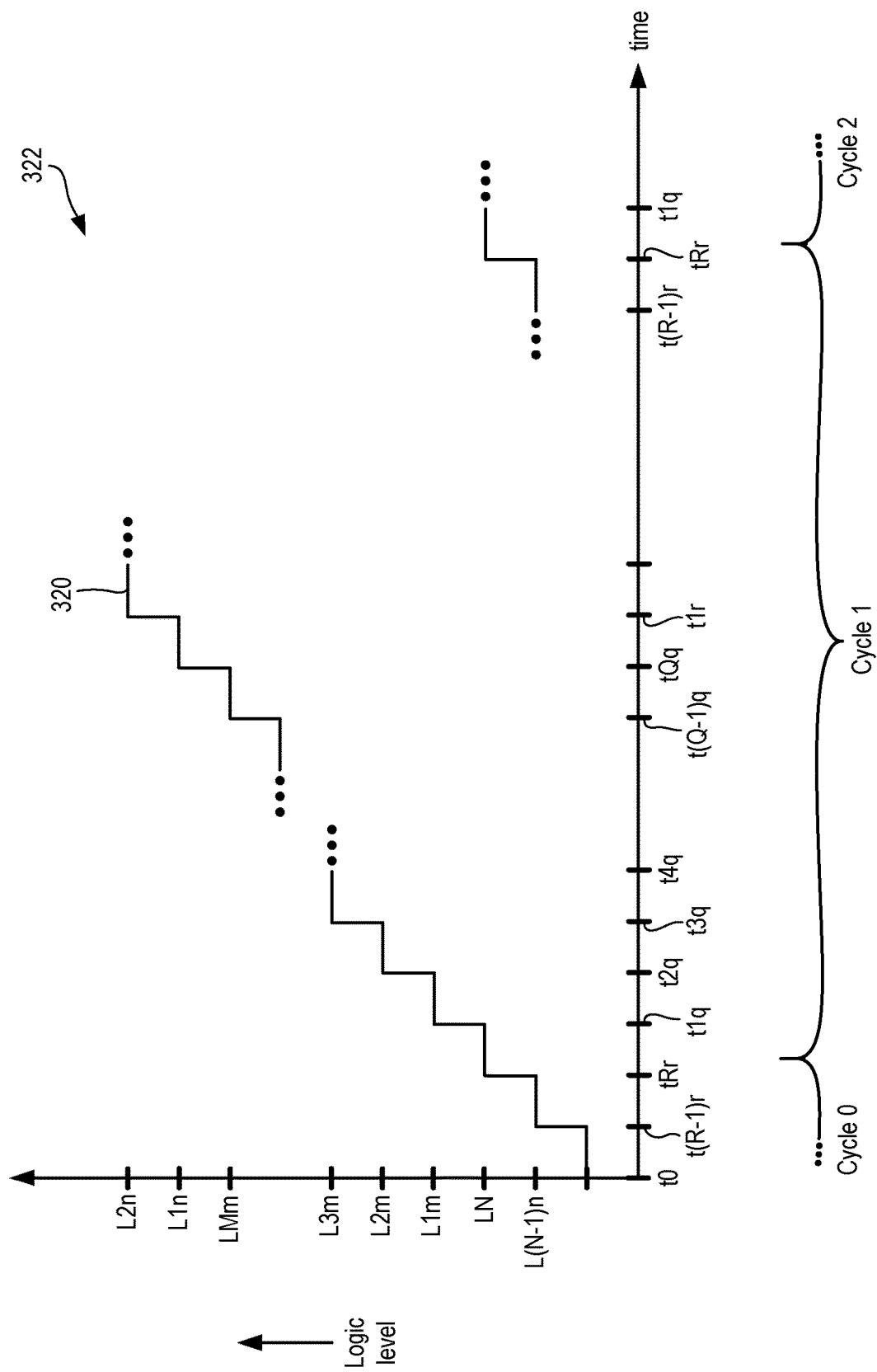
FIG. 3C is an embodiment of a graph that plots a logic level of another digital pulsed signal versus time.

Another example of the digital pulsed signal is a digital pulsed signal 320 that is illustrated in FIG. 3C. FIG. 3C is an embodiment of a graph 322 that plots a logic level of the digital pulsed signal 320 versus the time t.

The digital pulsed signal 322 has a logic level for each of the bins 1m through Nn illustrated in FIG. 1D-1. For example, the digital pulsed signal 322 has the logic level L(N−1)n for the bin (N−1)n of FIG. 1D-1, has the logic level LN for the bin Nn of FIG. 1D-1, has the logic level L1m for the bin 1m of FIG. 1D-1, has the logic level L2m for the bin 2m of FIG. 1D-1 and so until the logic level LM for the bin Mm of FIG. 1D-1. The logic level L(N−1)n occurs during a time period between a time t(R−1)r and the time tRr.

Similarly, the logic level LNn occurs during a time period between the times tRr and the time t1q, the logic level L1m occurs during a time period between the times t1q and t2q, the logic level L2m occurs during a time period between the times t2q and t3q, the logic level L3m occurs during a time period between the times t3q and t4q, the logic level LMm occurs during a time period between a time t(Q−1)q and the time tQq. The logic levels L1m through LNn repeat during each cycle of the voltage 112.

Referring back to FIG. 3A, the processor 214 also sends, via the transfer cable 236B to the DSP, information identifying a cycle of the voltage 112. For example, the processor 214 sends the information indicating whether the cycle of the voltage 112 is the cycle 0, or the cycle 1, or the cycle 2. In addition, the processor 214 sends instructions indicating a number of cycles of the voltage 112 for which to apply one or more of the frequency values HF1m through HFNn for the pre-stored number of bins.

The DSP receives the high frequency levels HF1m through HFNn and sends each of the high frequency levels HF1m through HFNn to a corresponding one of the auto-frequency tuners AFTbin1m through AFTbinNn. The DSP receives the information identifying the cycle of the voltage 112, the instructions indicating the number of cycles for which to apply the one or more of the frequency values HF1m through HFNn for the pre-stored number of bins, and the digital pulsed signal from the processor 214.

The DSP sends the frequency levels HF1m through HFNn to the corresponding auto-frequency tuners AFT1m through AFTNn for storage. For example, the DSP sends the frequency level HF1m to the auto-frequency tuner AFT1m for storage in a memory device of the auto-frequency tuner AFT1n, the frequency level HFMm to the auto-frequency tuner AFTMm for storage in a memory device of the auto-frequency tuner AFTMm, and the frequency level HFTNn to the auto-frequency tuner AFTNn for storage in a memory device of the auto-frequency tuner AFTNn.

Upon receiving the digital pulsed signal and the information regarding the cycle of the voltage 112, the DSP determines a logic level of the digital pulsed signal and identifies the cycle of the voltage. For example, the DSP determines whether there is match between the logic level LN and a pre-stored logic level, also LN, within a memory device of the DSP. If so, the DSP determines the logic level of the digital pulsed signal to be LN. As another example, the DSP determines whether there is match between the logic level LM and a pre-stored logic level, also LM, within the memory device of the DSP. If so, the DSP determines the logic level of the digital pulsed signal to be LM.

Upon determining the logic level and identifying the cycle the voltage 112, the DSP sends a control signal to a corresponding AFT of the HF RF generator during a time period of the logic level for a number of cycles that are received in the instructions from the processor 214. For example, the DSP sends a control signal during the bin 1m of the cycle 2 to the auto-frequency tuner AFT1m and sends another control signal during the bin Mm of the cycle 2 to the auto-frequency tuner AFTMm. Similarly, the DSP sends a control signal during the bin 1n of the cycle 2 to the auto-frequency tuner AFTNn and sends a control signal during the bin Nn of the cycle 2 to the auto-frequency tuner AFTNn.

Each of the auto-frequency tuners AFT1m through AFTNn provides a corresponding one of the high frequency values HF1m through HFNn during a correspond one of the bins 1m through Nn to the HF power supply. For example, in response to the control signals from the DSP, the auto-frequency tuner AFT1m provides the high frequency level HF1m during the bin 1m of the cycle 2 to the HF power supply and the auto-frequency tuner AFTMm provides the high frequency level HFMm during the bin Mm of the cycle 2 to the HF power supply. Also, in response to the control signals from the DSP, the auto-frequency tuner AFT1n provides the high frequency level HF1n during the bin 1n of the cycle 2 to the HF power supply and the auto-frequency tuner AFTNn provides the high frequency level HFNn during the bin Nn of the cycle 2 to the HF power supply.

The HF power supply generates the RF signal 218B having each of the frequencies 1m through Nn during a time period for a corresponding one of the bins 1m through Nn. For example, upon receiving the high frequency level HF1m during the bin 1m of the cycle 2, the HF power supply generates a portion of the RF signal 218B during the bin 1m of the cycle 2 of the voltage 112 and the portion of the RF signal 218B has the high frequency level HF1m.

Similarly, upon receiving the high frequency level HFMm during the bin Mm of the cycle 2, the HF power supply generates a portion of the RF signal 218B during the bin Mm of the cycle 2 of the voltage 112 and the portion of the RF signal 218B has the high frequency level HFMm.

Also, upon receiving the high frequency level HF1n during the bin 1n of the cycle 2, the HF power supply generates a portion of the RF signal 218B during the bin 1n of the cycle 2 of the voltage 112 and the portion of the RF signal 218B has the high frequency level HF1n.

Similarly, upon receiving the high frequency level HFNn during the bin Nn of the cycle 2, the HF power supply generates a portion of the RF signal 218B during the bin Nn of the cycle 2 of the voltage 112 and the portion of the RF signal 218B has the high frequency level HFNn.

Also, the DSP receives one or more power levels from the processor 214 via the transfer cable 236B and sends the one or more power levels to the power controller PWR. The power controller PWR provides the one or more power levels to the HF power supply. Upon receiving the one or more power levels, the HF power supply generates the RF signal 218B having the one or more power levels.

In one embodiment, one or more of the auto-frequency tuners AFT1m through AFTNn are combined into a single auto-frequency tuner. In an embodiment, one or more of the auto-frequency tuners AFT1m through AFTNn are parts of the DSP.

Figure 4:
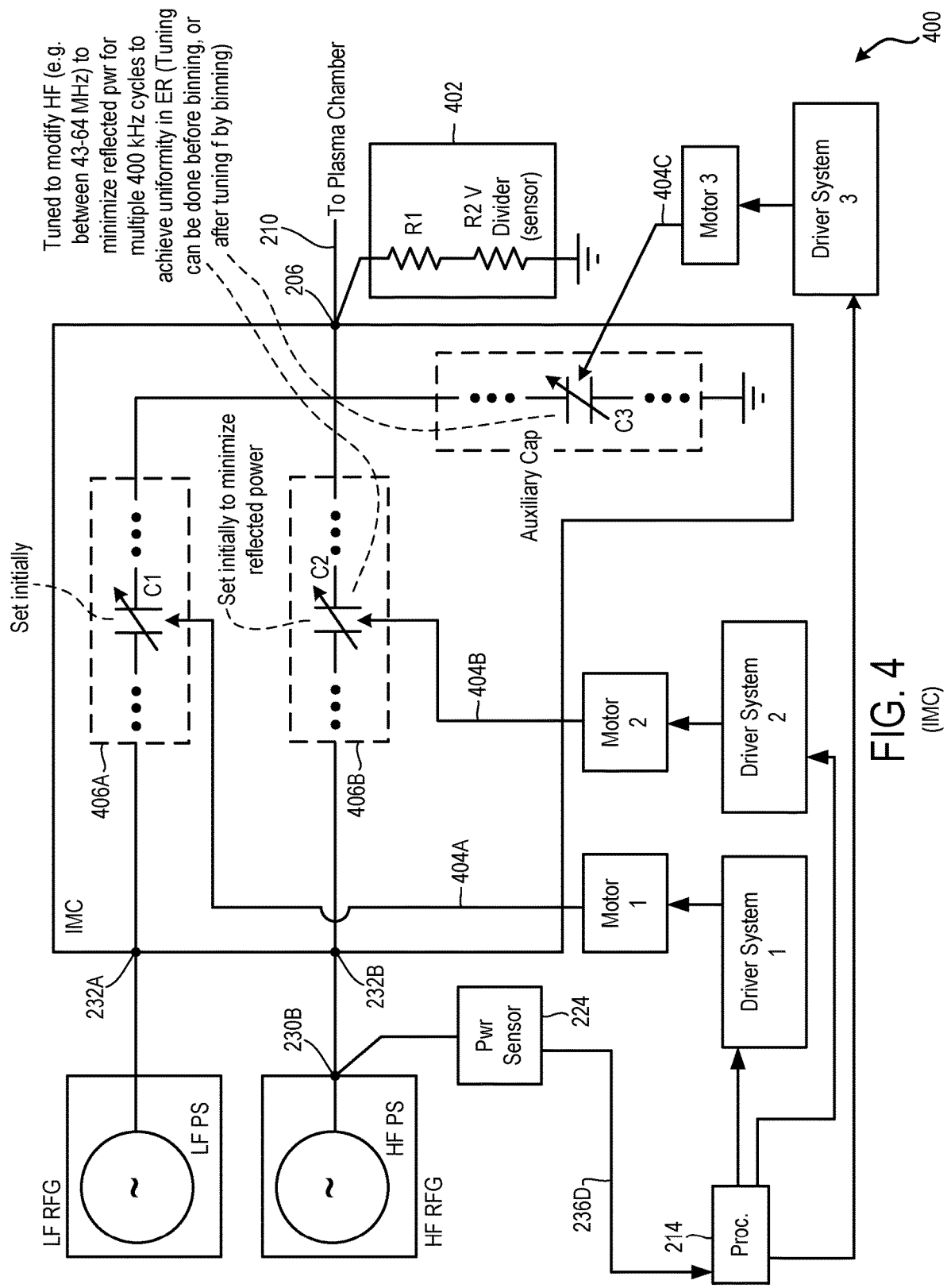
FIG. 4 is a diagram of an embodiment of a system to illustrate a control of an auxiliary capacitor of an impedance matching circuit (IMC) to modify a frequency within a high frequency range to control power delivered by the HF RF generator.

FIG. 4 is a diagram of an embodiment of a system 400 to illustrate a control of an auxiliary capacitor C3 of an impedance matching circuit (IMC) to modify a frequency within the high frequency range to control power delivered by the HF RF generator. The system 400 includes the LF RF generator, the HF RF generator, the power sensor 224, the processor 214, the IMC, a motor 1, a motor 2, a motor 3, a driver system 1, a driver system 2, a driver system 3, and a voltage divider 402. The LF RF generator includes an LF power supply (PS), which is an RF oscillator. The LF power supply is coupled to the RF cable 234A (FIG. 2).

An example of each motor 1, 2, and 3 includes an electric motor, which includes a stator and a rotor. An example of each driver system, described herein, includes one or more transistors.

The IMC includes a main circuit and an auxiliary match circuit. The main match circuit includes a branch circuit 406A and a branch circuit 406B. The branch circuit 406A includes one or more electrical components including a capacitor C1 and the branch circuit 406B includes one or more electrical components including a capacitor C2. Each capacitor C1 and C2 is a series capacitor. The branch circuit 406A is an example of the first branch circuit and the branch circuit 406B is an example of the second branch circuit. Also, the auxiliary match circuit includes one or more electrical components including a capacitor C3. Each capacitor C1 through C3 is a variable capacitor.

Each motor is connected to a corresponding capacitor of the IMC by a corresponding connection, such as one or more rods or a combination of multiple rods and one or more gears. For example, the motor 1 is connected to a plate of the capacitor C1 via a connection 404A, the motor 2 is connected to a plate of the capacitor C2 via a connection 404B, and the motor 4 is connected to a plate of the capacitor C3 via a connection 404C.

The voltage divider 402 is an example of the voltage sensor 204 (FIG. 2). The voltage divider 402 includes a resistor R1 and a resistor R2, and the two resistors R1 and R2 are coupled to each other in series.

Before dividing the voltage 112 into bins, the processor 214 sets values of capacitances of the capacitors C1 and C2. For example, the processor 214 sends a control signal to the driver system 1 based on a pre-determined capacitance of the capacitor C1. The driver system 1 generates a current signal upon receiving the control signal and sends the current signal to the motor 1. The motor 1 operates to change a capacitance of the capacitor C1 to the pre-determined capacitance. The motor 1 operates to move a plate of the capacitor C1 with respect to an oppositely-facing plate of the capacitor C1 to achieve the pre-determined capacitance.

Similarly, as another example, the processor 214 sends a control signal to the driver system 2 based on a pre-determined capacitance of the capacitor C2. The driver system 2 generates a current signal upon receiving the control signal and sends the current signal to the motor 2. The motor 2 operates to change a capacitance of the capacitor C2 to the pre-determined capacitance. The motor 2 operates to move a plate of the capacitor C2 with respect to an oppositely-facing plate of the capacitor C2 to achieve the pre-determined capacitance.

Once the pre-determined capacitances of the capacitor C1 and C2 are set, the processor 214 divides the voltage 112 into bins to determine the frequency values for the bins to further control the delivered power at the output 230B of the HF RF generator.

The processor 214 also controls the capacitor C3 of the auxiliary match circuit to control the delivered power at the output 230B of the HF RF generator. For example, the processor 214 receives the measurements of delivered power at the output 230B from the power sensor 224 via the transfer cable 236D. The processor 214 determines a statistical power value of delivered power for the pre-stored number of bins from the measurements in the same manner as that described above, and compares the statistical power value with the pre-determined statistical power value to determine that the pre-determined statistical power value of delivered power for the pre-stored number of bins is not achieved. Upon determining so, the processor 214 sends a control signal to the driver system 3. The driver system 3 generates a current signal upon receiving the control signal and sends the current signal to the motor 3. The motor 3 operates to change a capacitance of the capacitor C1. The motor 3 operates to move a plate of the capacitor C3 with respect to an oppositely-facing plate of the capacitor C3 to change the capacitance. The processor 214 continues to control the capacitor C3 in such a manner until the pre-determined statistical power value of delivered power for the pre-stored number of bins is achieved.

It should be noted that the capacitance of the capacitor C3 is controlled simultaneous with controlling the HF RF generator to operate at the high frequency values within the tables 240 and 242. The control of the capacitor C3 to achieve the pre-determined statistical power value of delivered power for the pre-stored number of bins facilitates generation of a voltage at the output 206 of the IMC. The voltage generated at the output 206 facilitates an application of one or more of the frequency levels HF1m through HFNn for the pre-stored number of bins from the HF RF generator via the IMC to the plasma chamber 220 to achieve the uniformity level UNFM.

In an embodiment, the capacitance of the capacitor C3 is controlled before controlling the HF RF generator to operate at the high frequency values within the tables 240 and 242. In one embodiment, the capacitance of the capacitor C3 is controlled after controlling the HF RF generator to operate at the high frequency values within the tables 240 and 242.

Figure 5:
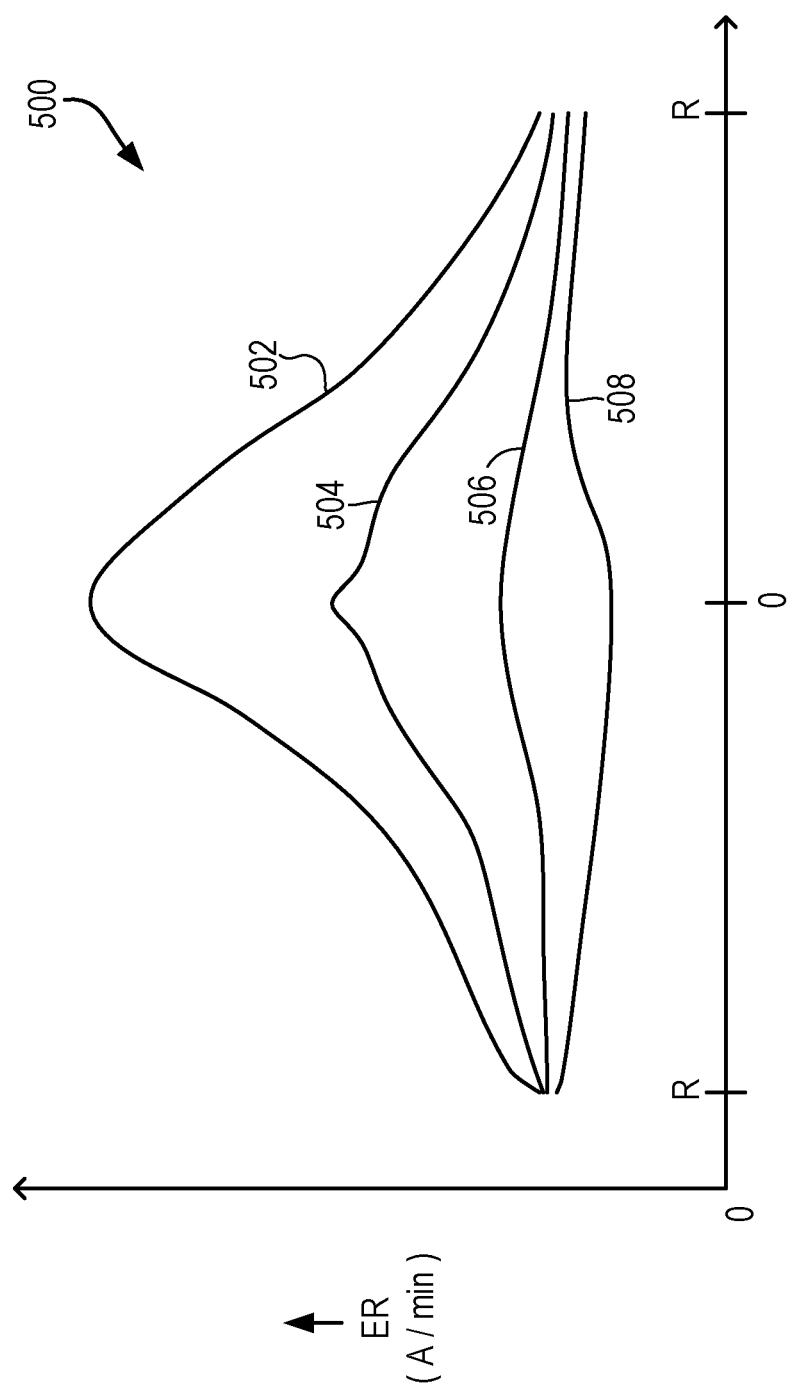
FIG. 5 is an embodiment of a graph to illustrate a change in uniformity in an etch rate when high frequency values for a pre-stored number of bins are applied.

FIG. 5 is an embodiment of a graph 500 to illustrate a change in uniformity in an etch rate when the high frequency values for the pre-stored number of bins are applied. The graph 500 plots the etch rate, measured in angstroms (A) per minute (min), along the y-axis, and plots a radius R of the substrate S along an x-axis. The graph 500 includes multiple plots 502, 504, 506, and 508 for different uniformities. The plot 508 indicates a higher level of uniformity than that illustrated by the plot 506. Similarly, the plot 506 indicates a higher level of uniformity than that illustrated by the plot 504 and the plot 504 indicates a higher level of uniformity than that illustrated by the plot 502.

By controlling the frequency levels of the HF RF generator during the pre-stored number of bins, uniformity in the etch rate across the substrate S is changed from that illustrated in the plot 502 to that illustrated in the plot 508. For example, by controlling the frequency levels of the HF RF generator to range between the values HF1m through HFNn during the cycle 2 and beyond of the voltage 112, uniformity in the etch rate increases from that illustrated in the plot 502 to that illustrated in the plot 508.

In one embodiment, frequency levels of the HF RF generator are controlled during the pre-stored number of bins to decrease the uniformity from that illustrated in the plot 508 to that illustrated in any of the plots 502, 504, and 506.

Figure 6A:
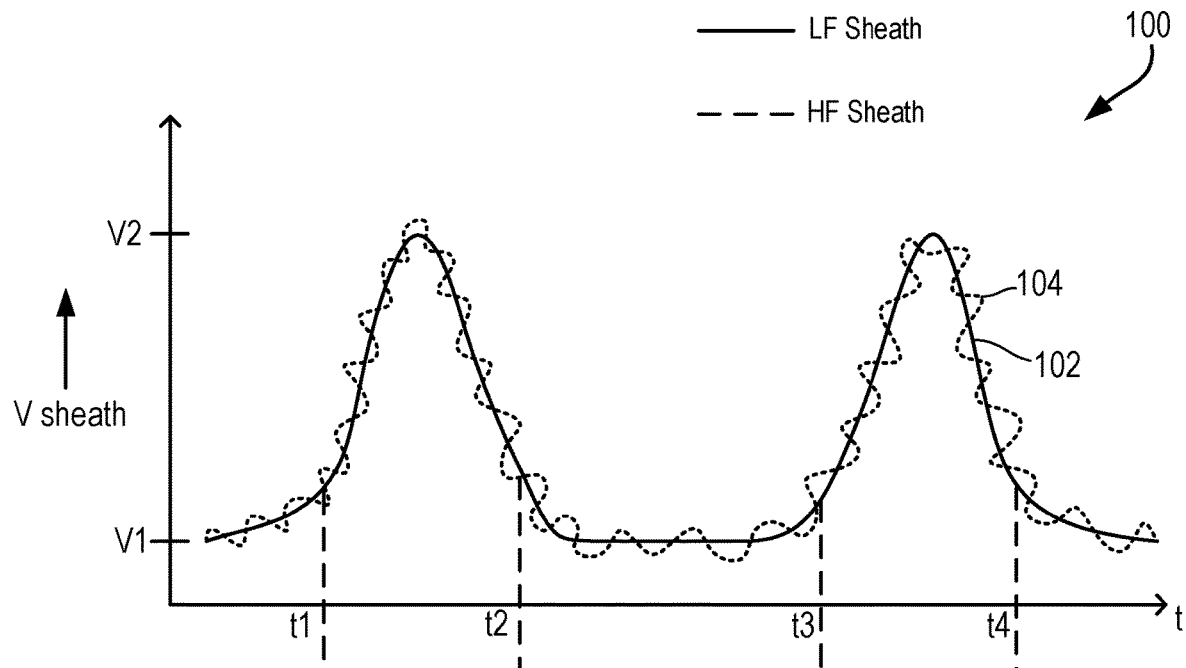
FIG. 6A is an embodiment of the graph of FIG. 1.

FIG. 6A is an embodiment of the graph 100.

Figure 6B:
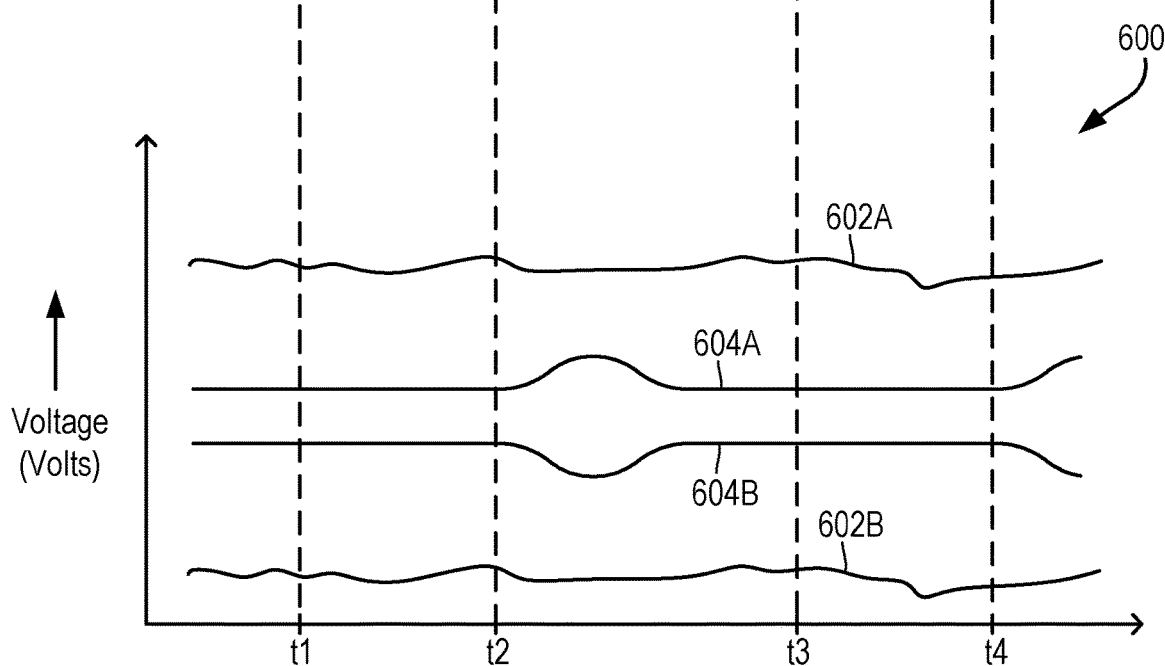
FIG. 6B is an embodiment of a graph to illustrate an increase in delivered power by applying the high frequency values for the pre-stored number of bins.

FIG. 6B is an embodiment of a graph 600 to illustrate an increase in delivered power by applying the high frequency values of the table 240 and 242. The graph 600 plots voltage on a y-axis and the time t on an x-axis. A voltage envelope for forward power measured by a directional coupler coupled at the output 230B (FIG. 2) of the HF RF generator is illustrated by plots 602A and 602B, and a voltage envelope for reflected power measured by the directional coupler coupled at the output 230B is illustrated by plots 604A and 604B. The plots 602A and 602B are of the voltage envelope that illustrates the supplied power at the output of the HF RF generator, and the plots 604A and 604B are of the voltage envelope that illustrates the reflected power at the output of the HF RF generator. As illustrated in FIGS. 6A and 6B, there is an increase in reflected power after the time t2 and after the time t4. The reflected power increases as a result of a decrease in the voltage 112 of the LF RF generator during each cycle of the voltage 112. By controlling the HF RF generator to achieve the high frequency values for the pre-stored number of bins, the reflected power at the output 230B is decreased and delivered power at the output 230B is increased.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

It should also be noted that in an embodiment, one or more features from any example, described above, are combined with one or more features of any other example, also described above, without departing from a scope described in various embodiments described in the present disclosure.

It should also be noted that in an embodiment, one or more features from any example, described above, are combined with one or more features of any embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for achieving uniformity in an etch rate for processing a substrate, comprising:
   receiving a voltage signal from an output of an impedance matching circuit;
   determining, for each cycle of the voltage signal, a positive crossing and a negative crossing of the voltage signal received from the output of the impedance matching circuit, wherein the negative crossing of each cycle is consecutive to the positive crossing of the cycle;
   dividing a time interval of each cycle of the voltage signal into a plurality of bins; and
   for one or more of the plurality of bins associated with the positive crossing and one or more of the plurality of bins associated with the negative crossing, adjusting a frequency of a radio frequency generator to output an adjusted frequency value, wherein said adjusting the frequency of the radio frequency generator includes controlling the radio frequency generator to modify the frequency of a radio frequency signal generated by the radio frequency generator, wherein the frequency of the radio frequency signal is modified based on the adjusted frequency value to achieve the uniformity in the etch rate.

2. The method of claim 1, wherein said determining the positive crossing includes:
   determining a point at which the voltage signal is at a pre-determined value; and
   determining that a value of the voltage signal increases at a time after the voltage signal is at the pre-determined value compared to a time before the voltage signal is at the pre-determined value.

3. The method of claim 1, wherein said determining the negative crossing includes:
   determining a point at which the voltage signal is at a pre-determined value; and
   determining that a value of the voltage signal decreases at a time after the voltage signal is at the pre-determined value compared to a time before the voltage signal is at the pre-determined value.

4. The method of claim 1, wherein the one or more of the plurality of bins associated with the positive crossing include a pre-determined number of bins, and wherein one of the pre-determined number of bins includes the positive crossing.

5. The method of claim 1, wherein the one or more of the plurality of bins associated with the negative crossing include a pre-determined number of bins, and wherein one of the pre-determined number of bins includes the negative crossing.

6. A method for achieving uniformity in an etch rate for processing a substrate, comprising:
   receiving a voltage signal from an output of an impedance matching circuit;
   determining, for each cycle of the voltage signal, a positive crossing and a negative crossing of the voltage signal received from the output of the impedance matching circuit, wherein the negative crossing of each cycle is consecutive to the positive crossing of the cycle;
   dividing a time interval starting from a time proximate to the positive crossing and ending at a time proximate to the negative crossing of each cycle of the voltage signal into a plurality of bins;
   for one or more of the plurality of bins, adjusting a frequency of a first radio frequency generator to output an adjusted frequency value, wherein said adjusting the frequency of the first radio frequency generator includes controlling the first radio frequency generator to modify the frequency of a radio frequency signal generated by the first radio frequency generator, wherein the frequency of the radio frequency signal is modified based on the adjusted frequency value to achieve the uniformity in the etch rate.

7. The method of claim 6, wherein said determining the positive crossing includes:
   determining a point at which the voltage signal is at a pre-determined value; and
   determining that a value of the voltage signal increases at a time after the voltage signal is at the pre-determined value compared to a time before the voltage signal is at the pre-determined value.

8. The method of claim 6, wherein said determining the negative crossing includes:
   determining a point at which the voltage signal is at a pre-determined value; and
   determining that a value of the voltage signal decreases at a time after the voltage signal is at the pre-determined value compared to a time before the voltage signal is at the pre-determined value.

9. The method of claim 6, wherein the time proximate to the positive crossing is a time at which the positive crossing occurs, and wherein the time proximate to the negative crossing is a time at which the negative crossing occurs.

10. The method of claim 6, wherein the time proximate to the positive crossing is a time within a first pre-determined range from and precedes a time at which the positive crossing occurs, and wherein the time proximate to the negative crossing is a time within a second pre-determined range from and follows a time at which the negative crossing occurs.

11. The method of claim 6, wherein each of the plurality of bins is of an equal time period.

12. The method of claim 6, wherein the voltage signal is received from a voltage sensor that is coupled to the output of the impedance matching circuit, and wherein the output of the impedance matching circuit is coupled to an input of a plasma chamber via a radio frequency transmission line.

13. The method of claim 6, wherein each cycle includes a first half portion and a second half portion, wherein the first half portion coincides with a time period during which a voltage of a plasma sheath reaches a highest point, and wherein the second half portion coincides with a time period during which the voltage of the plasma sheath reaches a lowest point.

14. The method of claim 6, wherein the plurality of bins includes a first bin and a second bin, wherein the first radio frequency generator has a higher frequency of operation compared to a second radio frequency generator, wherein the cycle represents operation of the second radio frequency generator, and wherein said adjusting the frequency includes:
changing a first value of the frequency during the first bin to achieve a second value; and
changing the second value of the frequency during the second bin to achieve a third value.

15. The method of claim 14, wherein the cycles of the voltage signal include a first cycle and a second cycle, wherein the first value is changed to achieve the second value during the first bin of the second cycle, and the second value is changed to achieve the third value during the second bin of the second cycle.

16. The method of claim 14, further comprising:
receiving a first measurement of delivered power, wherein the first measurement is associated with the first bin, wherein the first measurement is received from a sensor coupled to an output of the first radio frequency generator;
receiving a second measurement of the delivered power, wherein the second measurement is associated with the second bin,
wherein said changing the first value of the frequency includes increasing or decreasing the first value of the frequency to reduce the first measurement,
wherein said changing the second value of the frequency includes increasing or decreasing the second value of the frequency to reduce the second measurement.

17. The method of claim 16, wherein the reductions in the first and second measurements facilitate achieving the uniformity in the etch rate.

18. A controller for achieving uniformity in an etch rate for processing a substrate, comprising:
a processor configured to:
receive a voltage signal from an output of an impedance matching circuit;
determine, for each cycle of the voltage signal, a positive crossing and a negative crossing of the voltage signal received from the output of the impedance matching circuit, wherein the negative crossing of each cycle is consecutive to the positive crossing of the cycle;
divide a time interval starting from a time proximate to the positive crossing and ending at a time proximate to the negative crossing of each cycle of the voltage signal into a plurality of bins;
for one or more of the plurality of bins, adjust a frequency of a radio frequency generator to output an adjusted frequency value,
wherein to adjust the frequency of the radio frequency generator, the processor is configured to control the radio frequency generator to modify the frequency of a radio frequency signal generated by the radio frequency generator, wherein the frequency of the radio frequency signal is modified based on the adjusted frequency value to achieve the uniformity in the etch rate; and
a memory device coupled to the processor.

19. The controller of claim 18, wherein to determine the negative crossing, the processor is configured to:
determine a point at which the voltage signal is at a pre-determined value; and
determine that a value of the voltage signal increases at a time after the voltage signal is at the pre-determined value compared to a time before the voltage signal is at the pre-determined value.

20. The controller of claim 18, wherein to determine the negative crossing, the processor is configured to:
determine a point at which the voltage signal is at a pre-determined value; and
determine that a value of the voltage signal decreases at a time after the voltage signal is at the pre-determined value compared to a time before the voltage signal is at the pre-determined value.

21. The controller of claim 18, wherein the time proximate to the positive crossing is a time at which the positive crossing occurs, and wherein the time proximate to the negative crossing is a time at which the negative crossing occurs.

22. The controller of claim 18, wherein the time proximate to the positive crossing is a time within a first pre-determined range from and precedes a time at which the positive crossing occurs, and wherein the time proximate to the negative crossing is a time within a second pre-determined range from and follows a time at which the negative crossing occurs.

* * * * *